(12) United States Patent
Yanagidaira et al.

(10) Patent No.: US 11,227,662 B2
(45) Date of Patent: Jan. 18, 2022

(54) SEMICONDUCTOR MEMORY

(71) Applicant: TOSHIBA MEMORY CORPORATION, Tokyo (JP)

(72) Inventors: Kosuke Yanagidaira, Fujisawa Kanagawa (JP); Mario Sako, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 17/103,396

(22) Filed: Nov. 24, 2020

(65) Prior Publication Data

US 2021/0074370 A1  Mar. 11, 2021

Related U.S. Application Data

(62) Division of application No. 16/286,538, filed on Feb. 26, 2019, now Pat. No. 10,878,921.

(30) Foreign Application Priority Data

Aug. 10, 2018  (JP) .............................. JP2018-151665

(51) Int. Cl.
*G11C 11/34*     (2006.01)
*G11C 16/26*     (2006.01)
*G11C 16/04*     (2006.01)
*G11C 16/08*     (2006.01)
*G11C 11/56*     (2006.01)
*G11C 16/30*     (2006.01)
*G11C 16/24*     (2006.01)

(52) U.S. Cl.
CPC .......... *G11C 16/26* (2013.01); *G11C 11/5642* (2013.01); *G11C 11/5671* (2013.01); *G11C 16/0483* (2013.01); *G11C 16/08* (2013.01); *G11C 16/24* (2013.01); *G11C 16/30* (2013.01)

(58) Field of Classification Search
CPC . G11C 16/26; G11C 11/5642; G11C 11/5671; G11C 16/0483; G11C 16/08; G11C 16/24; G11C 16/30
USPC .................................................... 365/185.03
See application file for complete search history.

(56) References Cited

U.S. PATENT DOCUMENTS 8,760,937 B2  6/2014  Honda
8,773,917 B2  7/2014  Yuh
(Continued)

FOREIGN PATENT DOCUMENTS

JP       2013-232262 A    11/2013

*Primary Examiner* — Viet Q Nguyen
(74) *Attorney, Agent, or Firm* — Kim & Stewart LLP

(57) ABSTRACT

A semiconductor memory includes memory cells, a word line and bit lines of the memory cells, sense amplifiers connected to the bit lines, respectively, and a controller. Each sense amplifier includes first, second, and third transistors. The third transistor has one end connected to each of the first and second transistors, and the other end connected to a corresponding bit line. During a read operation, at a first time of a first period during which the controller applies a first read voltage to the word line, the controller applies a first voltage higher than ground voltage to the first transistor, and a second voltage to the second transistor. Also, at the first time, a first sense amplifier applies a voltage to a first bit line through its first and third transistors, and a second sense amplifier applies a voltage to a second bit line through its second and third transistors.

9 Claims, 26 Drawing Sheets

(56) References Cited

U.S. PATENT DOCUMENTS

| | | | |
|---|---|---|---|
| 9,190,156 B2 | 11/2015 | Sako | |
| 9,859,011 B1* | 1/2018 | Konno | G11C 16/3427 |
| 9,953,714 B2* | 4/2018 | Yanagidaira | G11C 7/04 |
| 10,014,054 B2* | 7/2018 | Maejima | H01L 27/1157 |
| 10,121,549 B2* | 11/2018 | Yanagidaira | G11C 16/26 |
| 10,204,692 B1* | 2/2019 | Kamata | G11C 16/0475 |
| 10,255,977 B2* | 4/2019 | Shimizu | G11C 16/32 |
| 10,297,326 B2* | 5/2019 | Kamata | G11C 16/26 |
| 10,515,703 B2* | 12/2019 | Yanagidaira | G11C 16/26 |
| 10,553,283 B2* | 2/2020 | Deguchi | G11C 16/30 |
| 10,566,051 B2* | 2/2020 | Shibata | G11C 16/08 |
| 10,777,239 B2* | 9/2020 | Sato | G11C 16/10 |
| 10,796,776 B2* | 10/2020 | Suzuki | G11C 16/30 |
| 10,878,921 B2* | 12/2020 | Yanagidaira | G11C 16/08 |
| 10,891,987 B2* | 1/2021 | Takagiwa | G11C 16/26 |
| 10,943,651 B2* | 3/2021 | Shibata | G11C 16/0483 |
| 10,957,403 B2* | 3/2021 | Deguchi | G11C 16/0483 |

* cited by examiner

FIG. 20

READ OPERATION (THIRD EMBODIMENT)

| READ VOLTAGE | KICK OPERATION |
|---|---|
| AR | OMIT |
| BR | OMIT |
| CR | OMIT |
| DR | EXECUTE |
| ER | EXECUTE |
| FR | EXECUTE |
| GR | EXECUTE |

FIG. 23

READ OPERATION (FOURTH EMBODIMENT)

| READ VOLTAGE | KICK OPERATION | KICK AMOUNT |
| --- | --- | --- |
| AR | OMIT | — |
| BR | OMIT | — |
| CR | OMIT | — |
| DR | EXECUTE | SMALL |
| ER | EXECUTE | SMALL |
| FR | EXECUTE | LARGE |
| GR | EXECUTE | LARGE |

SEMICONDUCTOR MEMORY

CROSS-REFERENCE TO RELATED APPLICATION

This application is a divisional of U.S. patent application Ser. No. 16/286,538, filed Feb. 26, 2019, which application is based upon and claims the benefit of priority from Japanese Patent Application No. 2018-151665, filed Aug. 10, 2018, the entire contents of which are incorporated herein by reference.

FIELD

Embodiments described herein relate generally to a semiconductor memory.

BACKGROUND

A NAND flash memory capable of storing data in a nonvolatile manner is known.

DESCRIPTION OF THE DRAWINGS

FIG. 20 is a table illustrating an example of setting of a kick operation in the read operation of a semiconductor memory according to a third embodiment.

FIG. 23 is a table illustrating an example of setting of a kick operation in the read operation of a semiconductor memory according to a fourth embodiment.

DETAILED DESCRIPTION

Figure 1:
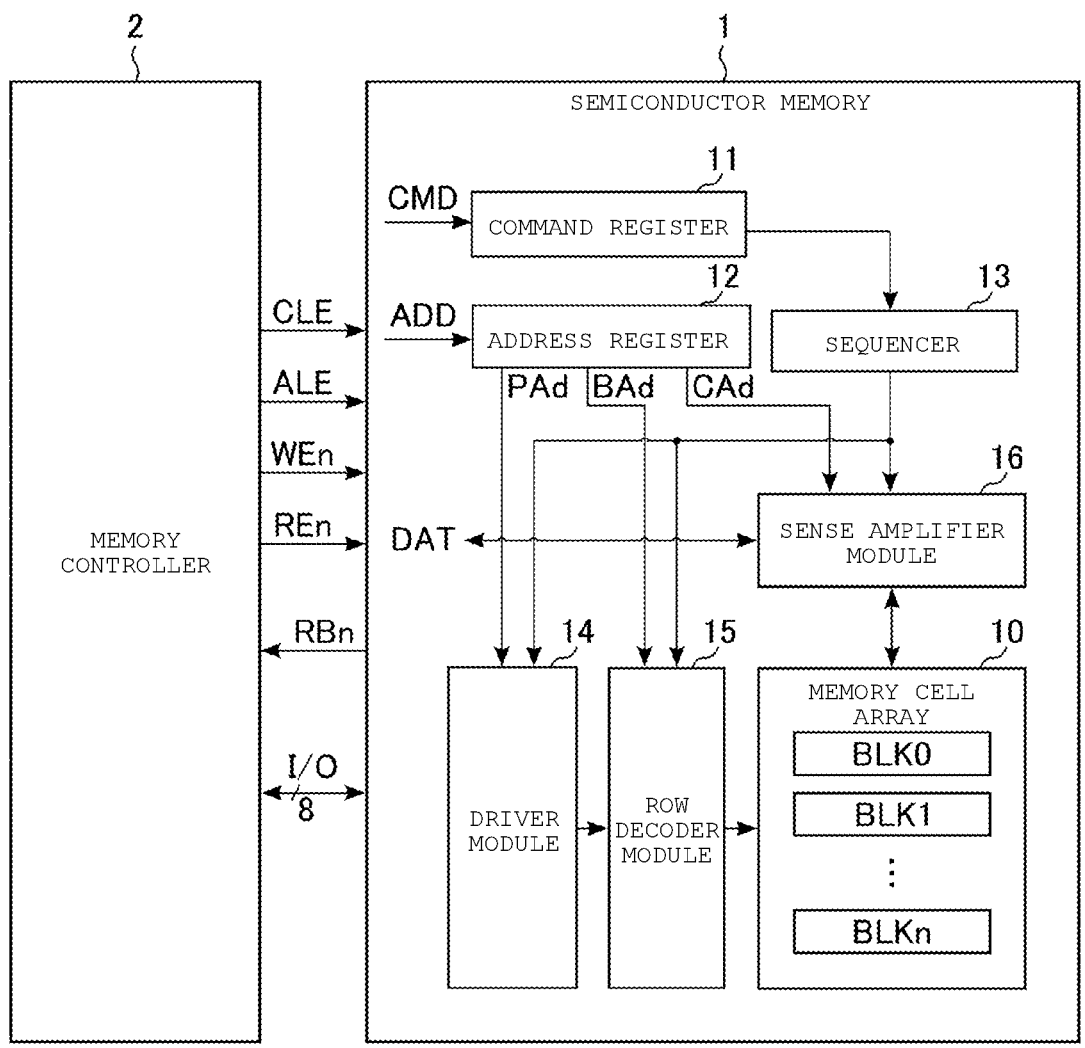
FIG. 1 is a block diagram illustrating a configuration example of a semiconductor memory according to a first embodiment.

Embodiments provide a semiconductor memory in which read operation is speeded up.

In general, according to one embodiment, there is provided a semiconductor memory including first and second memory cells, word lines, first and second bit lines, first and second sense amplifiers, and a controller. Each of the memory cells has a threshold voltage corresponding to multi-bit data stored therein. The word line is electrically connected to a gate of each of the first and second memory cells. The first and second bit lines are electrically connected to the first and second memory cells, respectively. The first and second sense amplifiers are electrically connected to the first and second bit lines, respectively, and each of the first and second sense amplifiers includes a first transistor, a second transistor, and a third transistor having one end electrically connected to each of the first transistor and the second transistor, and the other end electrically connected to a corresponding bit line. During a read operation, the controller applies a first read voltage to the word line, and at a first time of a first period during which the controller applies the first read voltage to the word line, the controller applies a first voltage higher than a ground voltage to the first transistor, and a second voltage different from the first voltage to the second transistor, and also at the first time, the first sense amplifier applies a voltage to the first bit line through the first transistor and the third transistor, and the second sense amplifier applies a voltage to the second bit line through the second transistor and the third transistor.

Hereinafter, embodiments will be described with reference to the drawings. Each embodiment shows an example of an apparatus and a method for embodying the technical idea of the disclosure. The drawings are schematic or conceptual, and the sizes and ratios in the drawings are not necessarily the same as the actual ones. The technical idea of the present disclosure is not limited to the shape, structure, arrangement, or the like of the elements illustrated in the drawings.

In the following description, elements having substantially the same function and configuration are given the same symbol. The numerals following the letters constituting the reference symbols are used to distinguish the elements having the same configuration. If there is no need to distinguish the elements having reference symbols including the same letter from each other, these elements are referred to using the reference symbols including only letters.

[1] First Embodiment

Hereinafter, a semiconductor memory 1 according to a first embodiment will be described.

[1-1] Configuration of Semiconductor Memory 1

[1-1-1] Overall Configuration of Semiconductor Memory 1

The semiconductor memory 1 is, for example, a NAND flash memory capable of storing data in a nonvolatile manner. The semiconductor memory 1 is controlled by, for example, an external memory controller 2. FIG. 1 illustrates a configuration example of the semiconductor memory 1 according to the embodiment.

As illustrated in FIG. 1, the semiconductor memory 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). The block BLK is a set of a plurality of memory cells capable of storing data in a nonvolatile manner, and is used as a data erase unit, for example.

Further, in the memory cell array 10, a plurality of bit lines and a plurality of word lines are provided. Each memory cell is associated with, for example, one bit line and one word line. The detailed configuration of the memory cell array 10 will be described later.

The command register 11 stores a command CMD received by the semiconductor memory 1 from the memory controller 2. The command CMD includes, for example, an instruction to cause the sequencer 13 to execute a read operation, a write operation, an erase operation, and the like.

The address register 12 stores address information ADD received by the semiconductor memory 1 from the memory controller 2. The address information ADD includes, for example, a block address BAd, a page address PAd, and a column address CAd. For example, the block address BAd, the page address PAd, and the column address CAd are used to select the block BLK, the word line, and the bit line, respectively.

The sequencer 13 controls the operation of the entire semiconductor memory 1. For example, the sequencer 13 controls the driver module 14, the row decoder module 15, the sense amplifier module 16, and the like based on the command CMD stored in the command register 11 to execute a read operation, a write operation, an erase operation, and the like.

The driver module 14 generates a voltage to be used in a read operation, a write operation, an erase operation, and the like. Then, the driver module 14 applies the generated voltage to the signal line corresponding to the selected word line, for example, based on the page address PAd stored in the address register 12.

The row decoder module 15 selects one block BLK in the corresponding memory cell array 10, based on the block address BAd stored in the address register 12. Then, the row decoder module 15 transfers, for example, the voltage applied to the signal line corresponding to the selected word line, to the selected word line in the selected block BLK.

In the write operation, the sense amplifier module 16 applies a desired voltage to each bit line, in accordance with the write data DAT received from the memory controller 2. Further, in the read operation, the sense amplifier module 16 determines the data stored in the memory cell based on the voltage of the bit line, and transfers the determination result to the memory controller 2 as read data DAT.

Communication between the semiconductor memory 1 and the memory controller 2 supports, for example, the NAND interface standard. For example, in the communication between the semiconductor memory 1 and the memory controller 2, a command latch enable signal CLE, an address latch enable signal ALE, a write enable signal WEn, a read enable signal REn, a ready busy signal RBn, and an input/output signal I/O are used.

The command latch enable signal CLE is a signal indicating that the input/output signal I/O received by the semiconductor memory 1 contains a command CMD. The address latch enable signal ALE is a signal indicating that the signal I/O received by the semiconductor memory 1 contains address information ADD. The write enable signal WEn is a signal instructing the semiconductor memory 1 to handle the input/output signal I/O as an input signal. The read enable signal REn is a signal instructing the semiconductor memory 1 to handle the input/output signal I/O as an output signal.

The ready busy signal RBn is a signal for notifying the memory controller 2 whether the semiconductor memory 1 is in a ready state in which it is ready to receive an instruction from the memory controller 2 or in a busy state in which it is not ready to receive an instruction. The input/output signal I/O is, for example, an 8-bit width signal, and may contain a command CMD, address information ADD, data DAT, and the like.

The semiconductor memory 1 and the memory controller described above may be packaged into a single semiconductor device by the combination of them. Examples of such a semiconductor device include a memory card such as an SD™ card, a solid state drive (SSD), and the like.

[1-1-2] Circuit Configuration of Memory Cell Array 10

Figure 2:
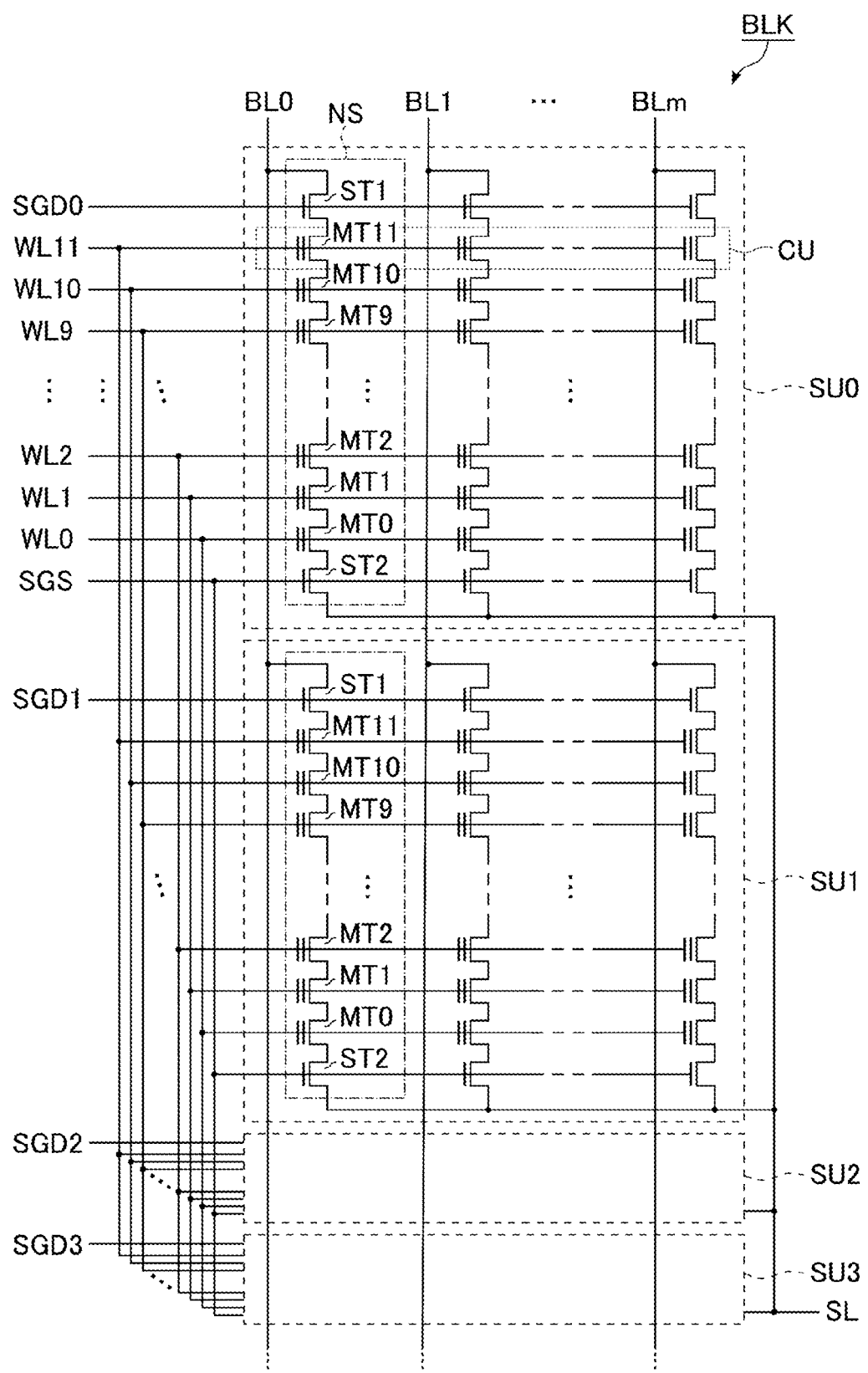
FIG. 2 is a circuit diagram illustrating an example of a circuit configuration of a memory cell array in the semiconductor memory according to the first embodiment.

FIG. 2 shows an example of the circuit configuration of one block BLK among a plurality of blocks BLK in the memory cell array 10 of the semiconductor memory 1.

As illustrated in FIG. 2, the block BLK includes, for example, four string units SU0 to SU3. Each string unit SU includes a plurality of NAND strings NS.

The plurality of NAND strings NS are associated with bit lines BL0 to BLm (m is an integer of 1 or more), respectively. Each NAND string NS includes, for example, memory cell transistors MT0 to MT11, and select transistors ST1 and ST2.

The memory cell transistor MT includes a control gate and a charge storage layer, and stores data in a nonvolatile manner. Each of the select transistors ST1 and ST2 is used for selecting the string unit SU during various operations.

In each NAND string NS, the memory cell transistors MT0 to MT11 are connected in series between select transistors ST1 and ST2. In the same block BLK, the control gates of the memory cell transistors MT0 to MT11 are commonly connected to the word lines WL0 to WL11, respectively.

In each NAND string NS, the drain of the select transistor ST1 is connected to the associated bit line BL, and the source of the select transistor ST1 is connected to one end of the memory cell transistors MT0 to MT11 connected in series. In the same block BLK, the gates of the select transistors ST1 in the string units SU0 to SU3 are commonly connected to the select gate lines SGD0 to SGD3, respectively.

In each NAND string NS, the drain of the select transistor ST2 is connected to the other end of the memory cell transistors MT0 to MT11 connected in series. In the same block BLK, the sources of the select transistors ST2 are commonly connected to the source line SL, and the gates of the select transistors ST2 are commonly connected to the select gate line SGS.

In the circuit configuration of the memory cell array 10 described above, the bit line BL is commonly connected across the plurality of NAND strings NS corresponding to each block BLK, for example. The source line SL is commonly connected across a plurality of blocks BLK, for example.

A set of a plurality of memory cell transistors MT connected to a common word line WL in one string unit SU is referred to as a cell unit CU, for example. For example, the storage capacity of the cell unit CU including the memory cell transistors MT each storing 1 bit data is defined as "one page data". The cell unit CU may have a storage capacity of two page data or more, according to the number of bits of data stored in the memory cell transistor MT.

In addition, the circuit configuration of the memory cell array 10 in the semiconductor memory 1 according to the embodiment is not limited to the configuration described above. For example, it may be designed such that the number of memory cell transistors MT and select transistors ST1 and ST2 in each NAND string NS is any number. It may be designed such that the number of string units SU in each block BLK is any number.

[1-1-3] Structure of Memory Cell Array 10

Hereinafter, an example of the structure of the semiconductor memory 1 according to the embodiment will be described.

In the drawings referred to below, an X direction corresponds to the extension direction of the word line WL, a Y direction corresponds to the extension direction of the bit line BL, and a Z direction corresponds to the vertical direction with respect to the surface of the semiconductor substrate 20 on which the semiconductor memory 1 is formed.

Further, in the cross-sectional views referred to below, for ease of viewing, elements such as insulating layers (interlayer insulating films), wirings, and contacts are appropriately omitted. Further, in the plan views, hatching is appropriately added for ease of viewing. The hatching added in the plan views is not necessarily related to the material or characteristics of the hatched elements.

Planar Layout of Memory Cell Array 10

Figure 3:
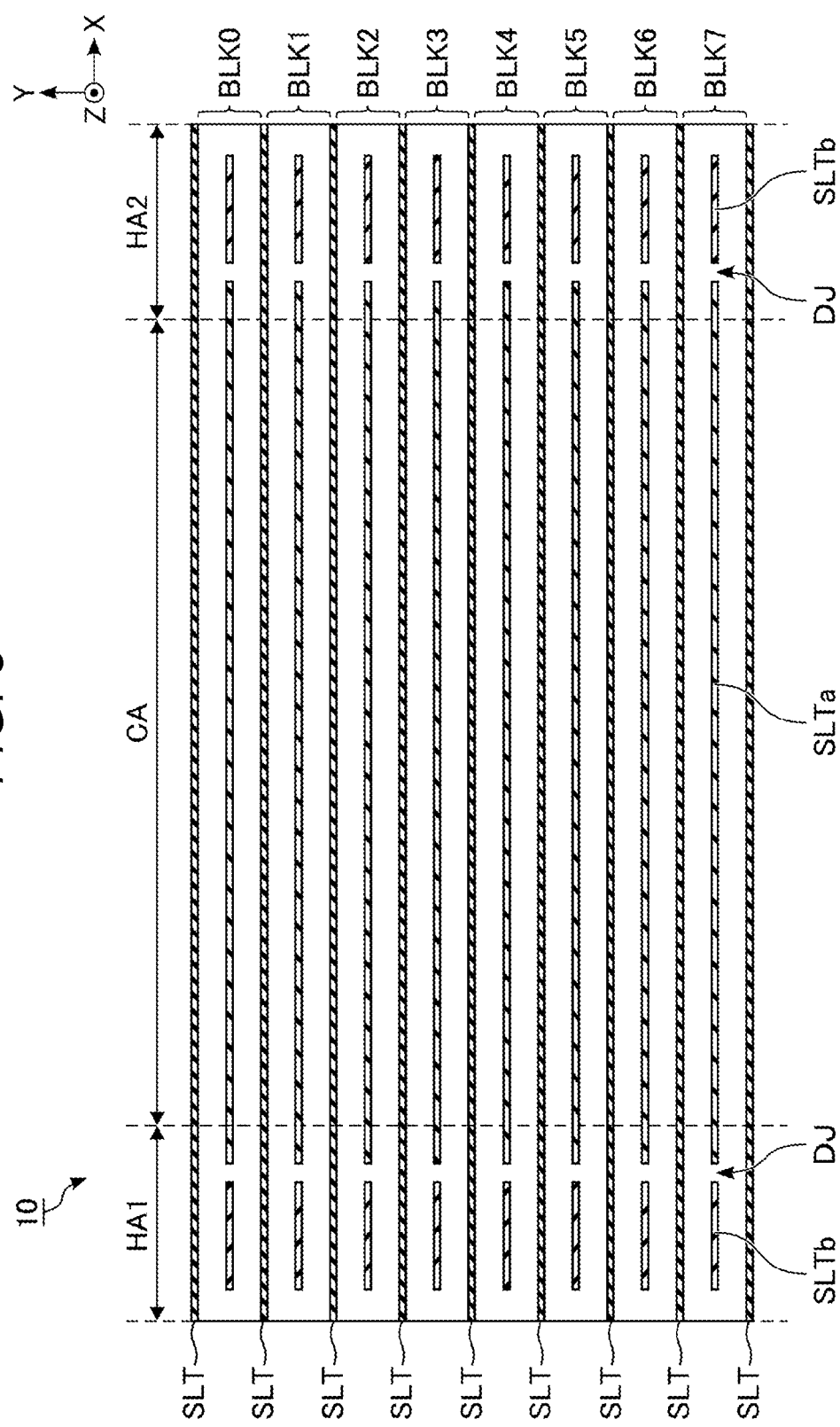
FIG. 3 is a plan view illustrating an example of a planar layout of the memory cell array in the semiconductor memory according to the first embodiment.

FIG. 3 illustrates an example of a planar layout of eight blocks BLK0 to BLK7 of the memory cell array 10 in the semiconductor memory 1 according to the embodiment.

As illustrated in FIG. 3, each of the blocks BLK0 to BLK7 extends along the X direction. The blocks BLK0 to BLK7 are arranged in the Y direction.

The area of the memory cell array 10 may be divided into, for example, a cell area CA and hookup areas HA1 and HA2 (referred to herein as extraction areas). For example, the extraction areas HA1 and HA2 are disposed at one end portion and the other end portion of the block BLK in the X direction, respectively. The cell area CA is disposed between the extraction area HA1 and the extraction area HA2.

In the cell area CA, a plurality of NAND strings NS are formed. In each of the extraction areas HA1 and HA2, a contact is formed for electrically connecting each of the select gate lines SGD and SGS and the word line WL connected to the NAND string NS to the row decoder module 15.

Further, in the area where the block BLK is provided, for example, a plurality of slits SLT, SLTa, and SLTb are provided. For example, an insulator is buried in each of the slits SLT, SLTa, and SLTb.

Each slit SLT is provided to extend from the extraction area HA1 to the extraction area HA2 along the X direction, and the plurality of slits SLT are arranged in the Y direction. For example, one slit SLTa and two slits SLTb are disposed between the adjacent slits SLT.

For example, the slits SLTa and SLTb are provided between the adjacent slits SLT and extend along the X direction, respectively. The two slits SLTb are arranged in the extraction areas HA1 and HA2, respectively. The slit SLTa is disposed between the slit SLTb in the extraction area HA1 and the slit SLTb in the extraction area HA2.

In other words, between the adjacent slits SLT, for example, a transverse slit extending in the X direction and including the slit dividing portion DJ is provided. The transverse slit is divided by the slit dividing portion DJ in each of the extraction areas HA1 and HA2.

Among the divided transverse slits, the slit portion extending from the extraction area HA1 to the extraction area HA2 corresponds to the slit SLTa, and the slit portions respectively provided in the extraction area HA1 and HA2 correspond to the slit SLTb.

The structure between the adjacent slits SLT described above corresponds to one block BLK, for example. It may be designed such that the number of slits SLTa and SLTb disposed between the slits SLT is any number. Between the slits SLT, the slit dividing portion DJ is optional and may be omitted.

Structure of Memory Cell Array 10 in Cell Area CA

Figure 4:
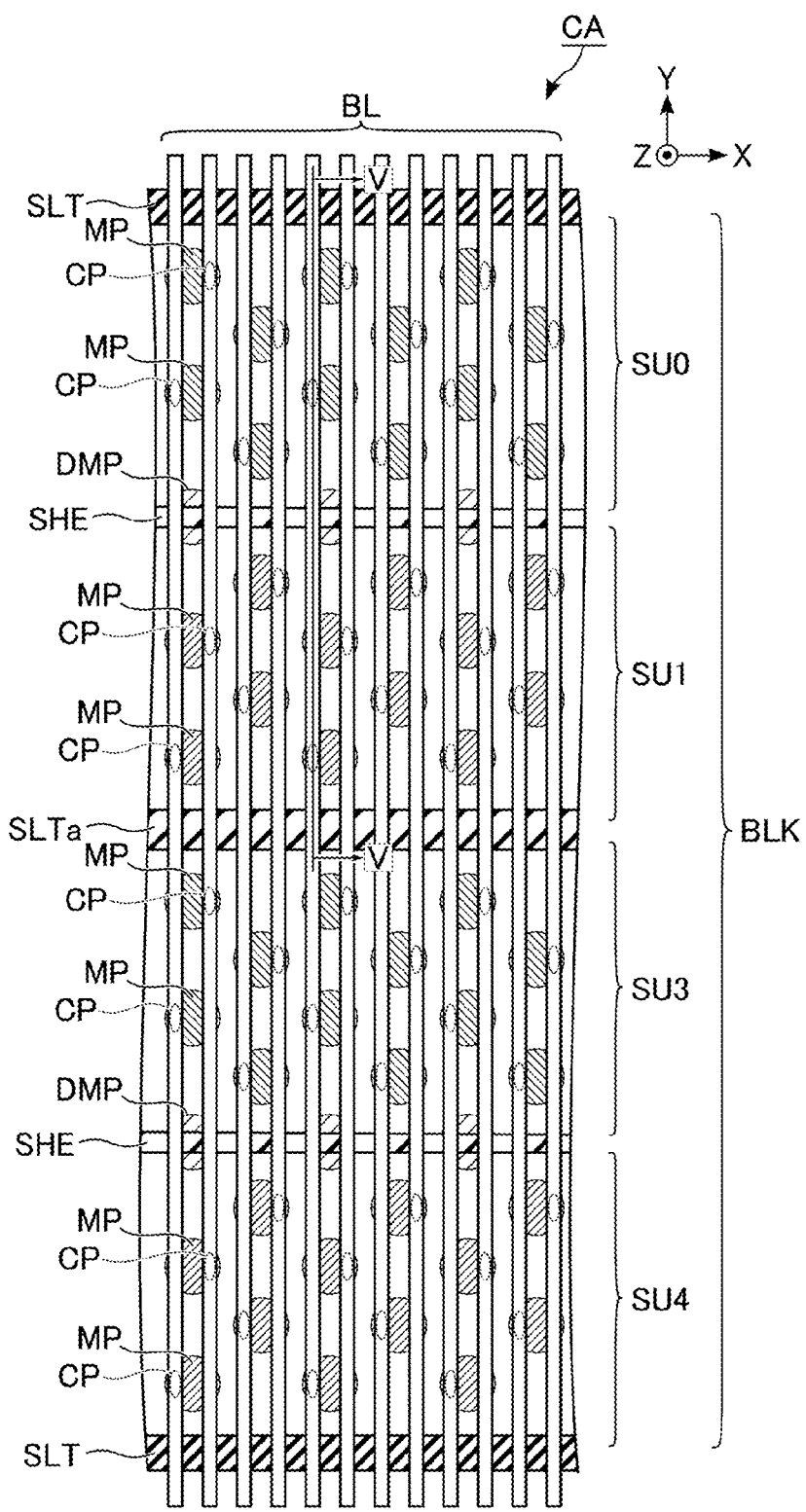
FIG. 4 is a plan view illustrating an example of a planar layout in a cell area of the memory cell array in the semiconductor memory according to the first embodiment.

FIG. 4 illustrates an example of a planar layout of one block BLK in the cell area CA of the memory cell array 10 in the semiconductor memory 1 according to the first embodiment.

As illustrated in FIG. 4, in the cell area CA, the memory cell array 10 includes, for example, a plurality of memory pillars MP and a plurality of dummy pillars DMP. Between the slit SLT and the slit SLTa, for example, a slit SHE is provided.

The slit SHE is provided to extend from the extraction area HA1 to the extraction area HA2 along the X direction. For example, an insulator is embedded in the slit SHE.

The dummy pillar DMP has a structure similar to, for example, the memory pillar MP, but is not used for storing data. The dummy pillar DMP is arranged, for example, so that the slit SHE partially overlies it.

The plurality of memory pillars MP are arranged, for example, in a staggered manner between the slit SLT and the slit SHE. Similarly, the plurality of memory pillars MP are arranged, for example, in a staggered manner between the slit SLTa and the slit SHE.

The memory pillar MP corresponds to, for example, one NAND string NS. For example, a set of a plurality of memory pillars MP provided between the slit SLT and the slit SHE corresponds to one string unit SU. Similarly, a set of a plurality of memory pillars MP provided between the slit SLTa and the slit SHE corresponds to another string unit SU.

Further, in the cell area CA, a plurality of bit lines BL and a plurality of contacts CP are provided in the memory cell array 10 corresponding to the arrangement of the memory pillars MP.

The plurality of bit lines BL respectively extend in the Y direction and are arranged in the X direction. Each bit line BL is arranged so as to overlie at least one memory pillar MP for each string unit SU. For example, two bit lines BL overlie each memory pillar MP.

The contact CP is disposed between one bit line BL among the plurality of bit lines BL that overlie the memory pillar MP, and the memory pillar MP. Each memory pillar MP is electrically connected to a corresponding bit line BL via the contact CP.

The number of string units SU provided between the adjacent slits SLT may be any number. The number and arrangement of the illustrated memory pillars MP is only an example, and the any number of memory pillars MP may be provided in any arrangement. In addition, any number of bit lines BL may overlie each memory pillar MP.

Figure 5:
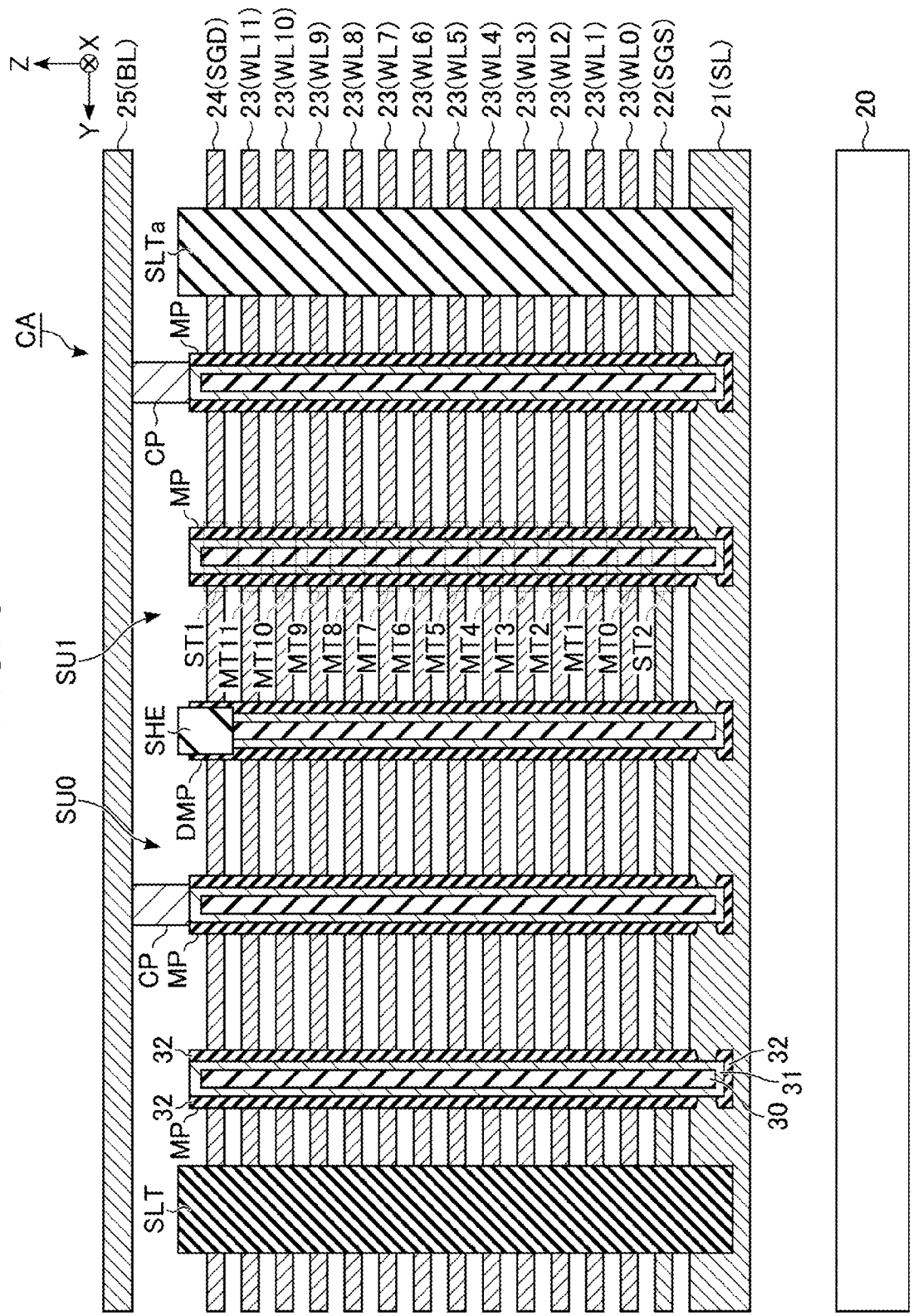
FIG. 5 is a cross-sectional view illustrating an example of a cross-sectional structure in the cell area of the memory cell array in the semiconductor memory according to the first embodiment.

FIG. 5 is a cross-sectional view of the memory cell array 10 taken along the line V-V in FIG. 4, showing an example of the sectional structure of the block BLK in the cell area CA.

As illustrated in FIG. 5, for example, conductors 21 to 25, the memory pillars MP, the dummy pillars DMP, the contacts CP, and the slits SLT, SLTa, and SHE are provided in the area corresponding to the cell area CA.

A conductor 21 is provided above the semiconductor substrate 20 with an insulating layer interposed therebetween. Although not illustrated, circuits such as the row decoder module 15 and the sense amplifier module 16 are provided in the insulating layer between the semiconductor substrate 20 and the conductor 21.

The conductor 21 is formed in a plate shape extending along the XY plane, for example, and is used as the source line SL.

A conductor 22 is provided on the conductor 21 with an insulating layer interposed therebetween. The conductor 22 is formed in a plate shape extending along the XY plane, for example, and is used as the select gate line SGS.

On the conductor 22, an insulating layer and a conductor 23 are alternately stacked. The conductor 23 is formed in a plate shape extending along the XY plane. For example, the plurality of stacked conductors 23 are used as word lines WL0 to WL11 sequentially from the semiconductor substrate 20 side.

A conductor 24 is provided on the conductor 23 with an insulating layer interposed therebetween. The conductor 24 is formed in a plate shape extending along the XY plane, for example, and is used as the select gate line SGD.

A conductor 25 is provided on the conductor 24 with an insulating layer interposed therebetween. The conductor 25 is formed in a line shape extending along the Y direction, for example, and is used as the bit line BL. That is, in an area not shown, a plurality of conductors 25 are arranged in the X direction.

The memory pillar MP is formed in a columnar shape extending along the Z direction and penetrates, for example, the conductors 22 to 24. For example, the upper end of the memory pillar MP is placed in the layer between the layer provided with the conductor 24 and the layer provided with the conductor 25. The lower end of the memory pillar MP is placed in a layer provided with the conductor 21, for example, and is in contact with the conductor 21.

Further, the memory pillar MP includes, for example, a core member 30, a semiconductor 31, and a stacked film 32. The core member 30 is, for example, an insulator, and is formed in a columnar shape extending along the Z direction. The upper end of the core member 30 is placed in a layer above the layer provided with the conductor 24, for example. The lower end of the core member 30 is placed in, for example, the layer provided with the conductor 21.

The core member 30 is covered with the semiconductor 31. The semiconductor 31 is in electrical contact with the conductor 21 via the side surface of the memory pillar MP. The stacked film 32 covers the side surface and the lower surface of the semiconductor 31 except a portion where the conductor 21 and the semiconductor 31 are in contact with each other.

Columnar contacts CP are provided on the semiconductor 31. A single conductor 25, that is, one bit line BL is in contact with the upper surface of the contact CP. The memory pillar MP and the conductor 25 may be electrically connected via two or more contacts, or may be electrically connected via other wirings.

The dummy pillar DMP is formed in a columnar shape extending along the Z direction and penetrates, for example, the conductors 22 to 24. The detailed structure of the dummy pillar DMP is similar to the structure of the memory pillar MP, for example. However, the contact CP is not connected to the dummy pillar DMP.

The slit SLT is formed in a plate shape extending along the XZ plane, for example, and divides the conductors 22 to 24. For example, the upper end of the slit SLT is placed in a layer between the layer including the upper end of the memory pillar MP and the layer provided with the conductor 25. The lower end of the slit SLT is placed in, for example, the layer provided with the conductor 21. The structure of the slit SLTa is the same as the structure of the slit SLT, for example.

The slit SHE is provided to extend in the X direction, for example, and divides the conductor 24. The slit SHE may divide a part of the dummy pillar DMP. For example, the upper end of the slit SHE is placed in a layer between the layer including the upper end of the memory pillar MP and the layer provided with the conductor 25. The lower end of the slit SHE is placed in, for example, a layer between the uppermost conductor 23 and the conductor 24. The slit SHE extending in the X direction may be divided by the dummy pillar DMP at a position overlapping with the dummy pillar DMP.

Figure 6:
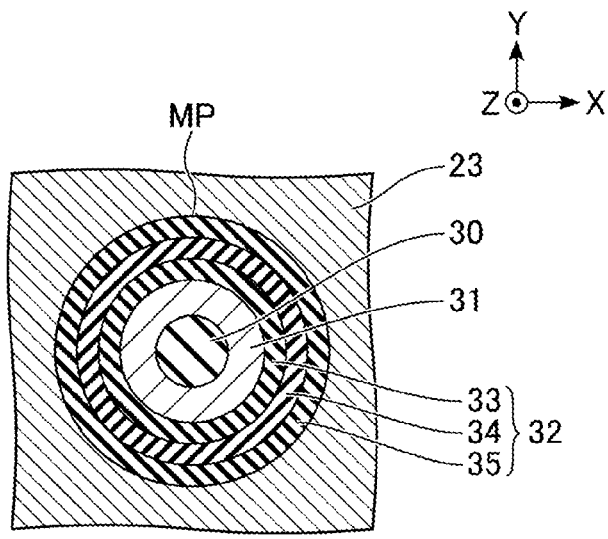
FIG. 6 is a cross-sectional view illustrating an example of a cross-sectional structure in a memory pillar in the semiconductor memory according to the first embodiment.

FIG. 6 illustrates an example of the cross-sectional structure of the memory pillar MP in a section parallel to the surface of the semiconductor substrate 20 and including the conductor 23.

As illustrated in FIG. 6, in the layer including the conductor 23, the core member 30 is provided in the central portion of the memory pillar MP. The semiconductor 31 surrounds the side surface of the core member 30. The stacked film 32 surrounds the side surface of the semiconductor 31. The stacked film 32 includes, for example, a tunnel oxide film 33, an insulating film 34, and a block insulating film 35.

The tunnel oxide film 33 surrounds the side surface of the semiconductor 31. The insulating film 34 surrounds the side surface of the tunnel oxide film 33. The block insulating film 35 surrounds the side surface of the insulating film 34. The conductor 23 surrounds the side surface of the block insulating film 35.

In the configuration of the memory pillar MP described above, for example, a portion where the memory pillar MP and the conductor 22 cross each other functions as the select transistor ST2. A portion where the memory pillar MP and the conductor 23 cross each other functions as the memory cell transistor MT. A portion where the memory pillar MP and the conductor 24 cross each other functions as the select transistor ST1.

That is, the semiconductor 31 in the memory pillar MP functions as the channel of each of the memory cell transistor MT and the select transistors ST1 and ST2. The insulating film 34 in the memory pillar MP functions as the charge storage layer of the memory cell transistor MT.

Structure of Memory Cell Array 10 in Extraction Area HA

Figure 7:
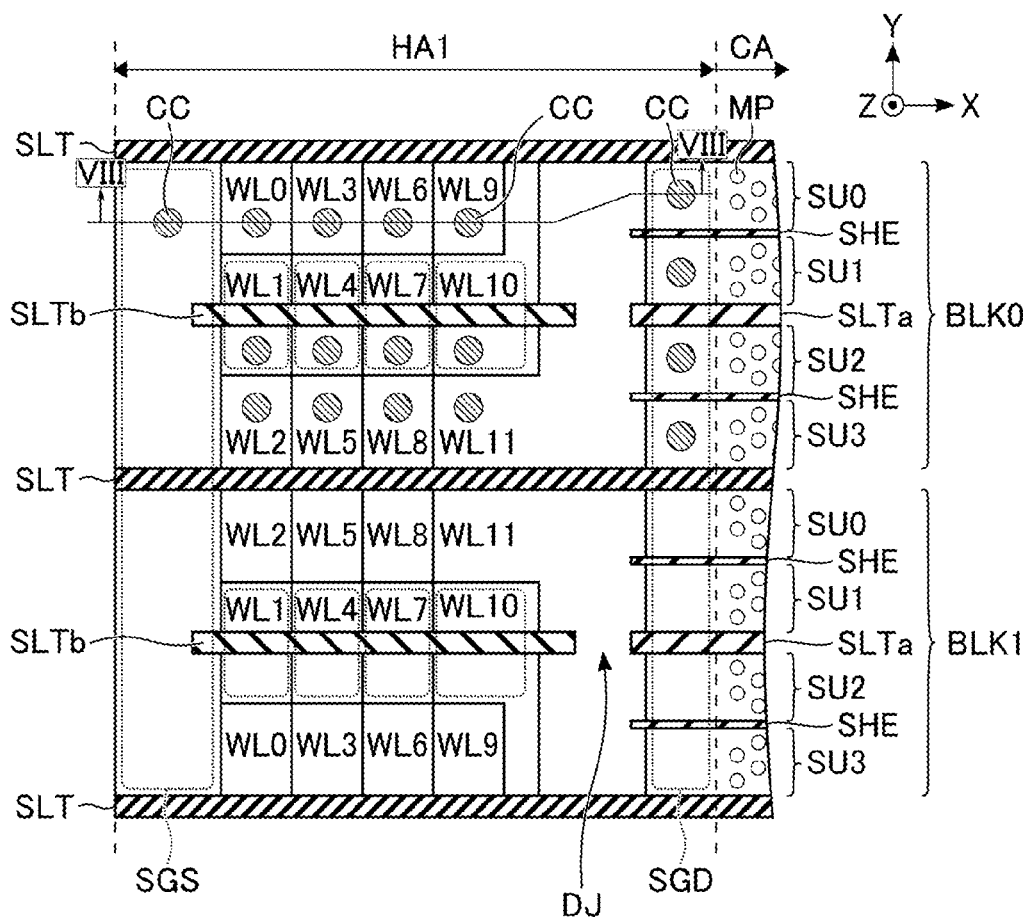
FIG. 7 is a plan view illustrating an example of a planar layout in an extraction area of the memory cell array in the semiconductor memory according to the first embodiment.

FIG. 7 illustrates an example of a planar layout of the extraction area HA1 of adjacent blocks BLK0 and BLK1 of the memory cell array 10 in the semiconductor memory 1 according to the first embodiment. First, the planar layout of the block BLK0 in the extraction area HA1 will be described.

As illustrated in FIG. 7, in the area corresponding to the block BLK0 in the extraction area HA1, the select gate line SGD (corresponding to conductor 24) is divided into four parts by the slits SLT, SLTa and SHE. The four-divided select gate lines SGD correspond to the string units SU0 to SU3, respectively.

The word lines WL0 to WL11 (corresponding to conductors 23) have a portion (in particular, terrace portion) which is not overlapped by a conductor of an upper layer. For example, the plurality of conductors 23 respectively corresponding to the word lines WL0 to WL11 are provided in three rows of stairs having two steps in the Y direction and having multiple steps formed in the X direction.

The slit dividing portion DJ is disposed, for example, in the terrace portion of the word line WL11. The word lines WL provided in the same layer in the same block BLK are electrically connected together via the slit dividing portion DJ. The slit SLTb is arranged to penetrate all of the conductors 23 so as to divide the terrace portion of the word lines WL1, WL4, WL7, and WL10.

The select gate line SGS (corresponding to conductor 22) is drawn out in the X direction from, for example, the end areas of the word lines WL0 to WL2. The slit SLTb does not divide the select gate line SGS in the embodiments illustrated herein. The select gate line SGS provided in each of the adjacent blocks BLK is divided by the slit SLT.

Further, in the area corresponding to the block BLK0, a contact CC is provided, for example, in each of the terrace portions of the select gate line SGS, the word lines WL0 to WL11, and the select gate line SGD.

The select gate line SGS, the word lines WL0 to WL11, and the select gate line SGD of the block BLK0 are electrically connected to the row decoder module 15 via the corresponding contact CC provided in the extraction area HA1.

The planar layout of the block BLK1 in the extraction area HA1 is the same as the layout obtained by inverting the planar layout of the block BLK0 with the X direction as a symmetric axis and is depicted in FIG. 7 without the contacts CC.

In this embodiment, the select gate line SGS, the word lines WL0 to WL11, and the select gate line SGD of the block BLK1 are also electrically connected to the row decoder module 15 via the contacts CC provided in the extraction area HA2.

Specifically, the planar layout of the blocks BLK0 and BLK1 in the extraction area HA2 is the same as, for example, those obtained by inverting the planar layout of the blocks BLK0 and BLK1 in the extraction area HA1 with the Y direction as the axis of symmetry, and providing the contacts CC corresponding to the wiring in the block BLK1.

Figure 8:
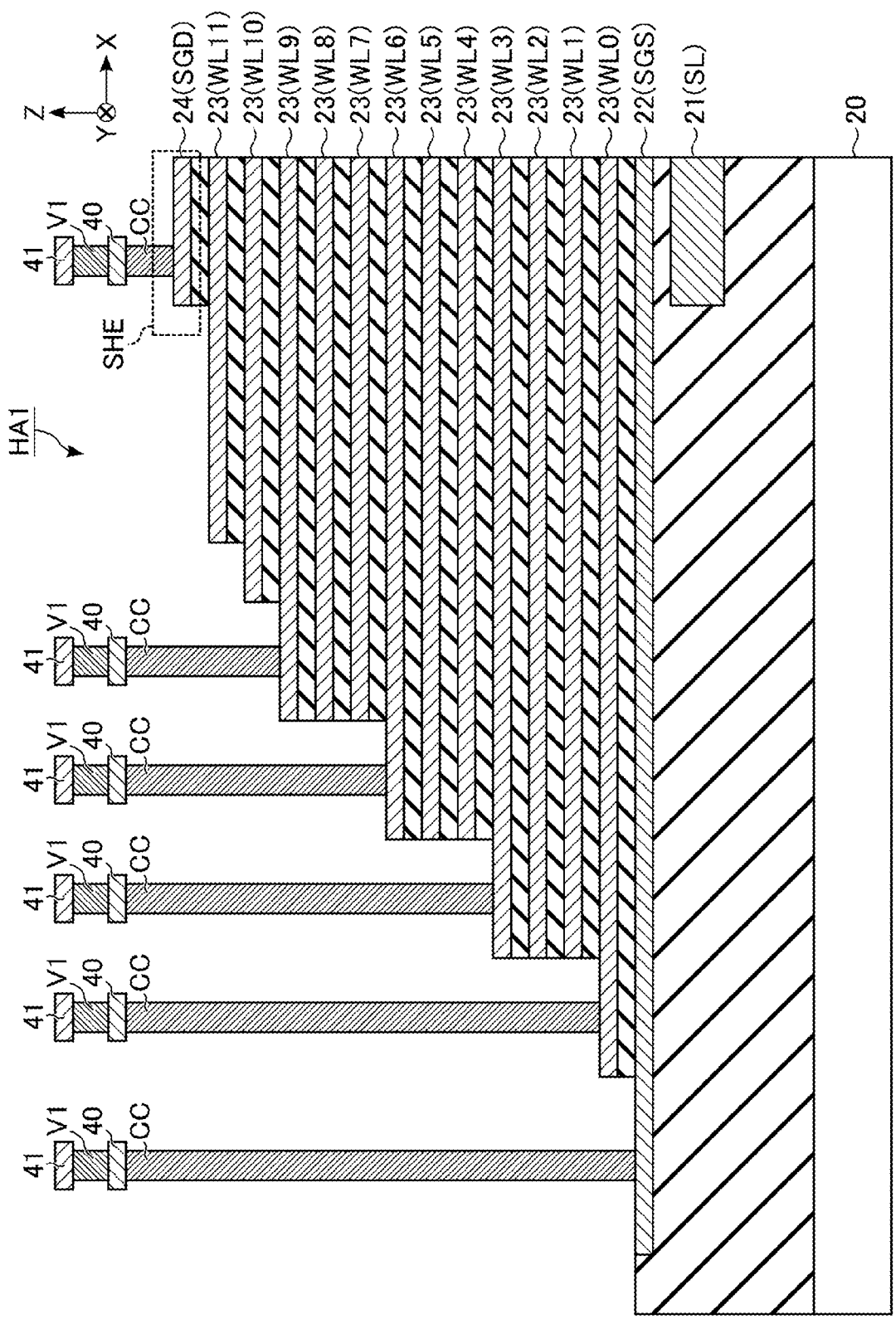
FIG. 8 is a cross-sectional view illustrating an example of a cross-sectional structure in the extraction area of the memory cell array in the semiconductor memory according to the first embodiment.

FIG. 8 is a cross-sectional view of the memory cell array 10 taken along the line VIII-VIII in FIG. 7, showing an example of the sectional structure of the block BLK in the extraction area HA. Further, in FIG. 8, the arrangement of the slit SHE provided in the depth direction of the cross-sectional view is indicated by a broken line.

As illustrated in FIG. 8, for example, conductors 21 to 24, conductors 40 and 41, and contacts CC and V1 are provided in an area corresponding to the block BLK0 in the extraction area HA1.

In the extraction area HA1, the end portion of the conductor 21 corresponding to the source line SL does not extend into the extraction area HA1 as far as the conductor 22 in the X direction, but is at least within the cell area CA. The end portion of each of the conductor 22, the conductor 23, and the conductor 24 respectively corresponding to the select gate line SGS, the word line WL, and the select gate line SGD has a portion that is not overlapped by conductor of the upper layer.

The slit SHE is provided to divide the conductor 24 corresponding to the select gate line SGD. Each contact CC is formed in a columnar shape extending along the Z direction. The contact CC includes, for example, a conductor formed in a columnar shape.

Each of the conductors 40 and 41 is a wiring for connecting the conductors 22 to 24 drawn out from the cell area CA to the extraction area HA1 to the row decoder module 15. The plurality of conductors 40 are provided on the plurality of contacts CC, respectively.

A plurality of contacts V1 are provided on the plurality of conductors 40, respectively. A plurality of conductors 41 are provided on the plurality of contacts V1, respectively. The conductors 40 and 41 may be connected via a plurality of contacts, or different wirings may be connected between the plurality of contacts.

In the structure of the block BLK0 in the extraction area HA1 described above, the wiring drawn out via the contact CC is electrically connected to a circuit under the memory cell array 10 via, for example, an area outside the extraction area HA1.

The present disclosure is not limited to this, and the wiring drawn out via the contact CC may be electrically connected, for example, via a contact penetrating a dummy block provided in the extraction area HA1, or a contact penetrating a wide terrace portion provided in the extraction area HA1, to a circuit under the memory cell array 10.

As described above, in the semiconductor memory 1 according to the first embodiment, a voltage is applied to the word line WL (the conductor 23) via the contact CC connected to one side in the X direction. Depending on the structure of the word line WL, the influence of RC delay of the wiring may not be ignored in the portion of the word line WL far from the connection point of the contact CC.

In the present specification, "RC delay" means the length of the RC delay time from the time a voltage is applied to the wiring until the voltage of the wiring rises to a target value. Further, in the following description, the portion of the word line WL far from the connection point of the contact CC is referred to as the "far end of the word line WL", and the portion of the word line WL closer to the connection point of the contact CC is referred to as "near end of the word line WL".

In the structure of the memory cell array 10 described above, the number of conductors 23 is based on the number of the word lines WL. A plurality of conductors 22 provided in a plurality of layers may be allocated to the select gate line SGS. In a case where the select gate line SGS is formed in a plurality of layers, a conductor different from the conductor 22 may be used. A plurality of conductors 24 provided in a plurality of layers may be allocated to the select gate line SGD.

[1-1-4] Circuit Configuration of Row Decoder Module 15

Figure 9:
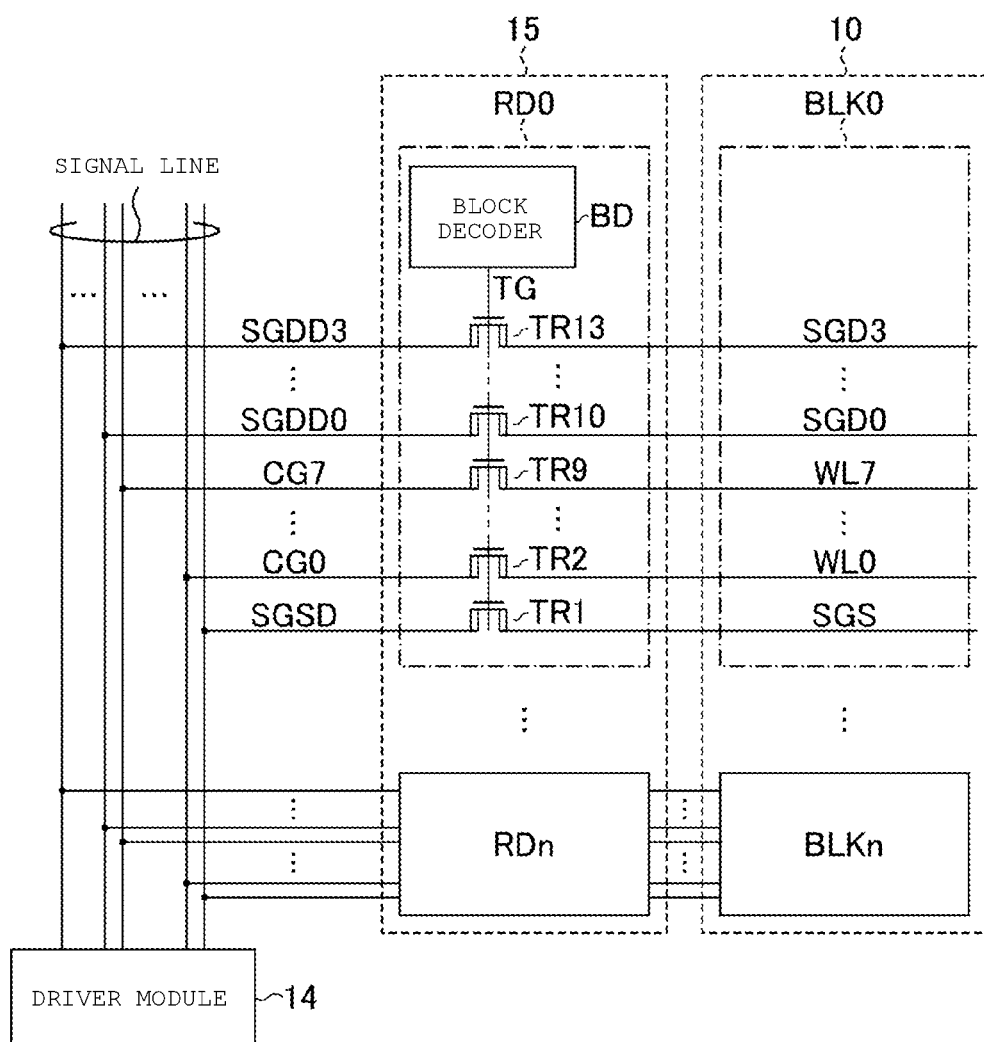
FIG. 9 is a circuit diagram illustrating an example of a circuit configuration of a row decoder module in the semiconductor memory according to the first embodiment.

FIG. 9 illustrates an example of a circuit configuration of the row decoder module 15 in the semiconductor memory 1 according to the first embodiment.

As illustrated in FIG. 9, the row decoder module 15 includes, for example, row decoders RD0 to RDn. The row decoder RD is used for selecting the block BLK. The row decoders RD0 to RDn are associated with the blocks BLK0 to BLKn, respectively.

The detailed circuit configuration of the row decoder RD will be described below focusing on the row decoder RD0 corresponding to the block BLK0.

The row decoder RD includes, for example, a block decoder BD, and high breakdown voltage n-channel MOS transistors TR1 to TR13.

The block decoder BD decodes the block address BA. Then, the block decoder BD applies a predetermined voltage to the transfer gate line TG based on the decoding result. The transfer gate line TG is commonly connected to the gates of the transistors TR1 to TR13. The transistors TR1 to TR13 are connected between various signal lines wired from the driver module 14 and various wirings of the associated block BLK.

Specifically, the driver module 14 is connected to signal lines SGDD0 to SGDD3, signal lines CG0 to CG7, and a signal line SGSD. The signal line SGDD0 to SGDD3 correspond to the select gate lines SGD0 to SGD3, respectively. The signal lines CG0 to CG7 correspond to the word lines WL0 to WL7, respectively. The signal line SGSD corresponds to the select gate line SGS.

One end of the transistor TR1 is connected to the signal line SGSD. The other end of the transistor TR1 is connected to the select gate line SGS. One ends of the transistors TR2 to TR9 are connected to the signal lines CG0 to CG7, respectively. The other ends of the transistors TR2 to TR9 are connected to the word lines WL0 to WL7, respectively. One ends of the transistor TRIO to TR13 are connected to the signal lines SGDD0 to SGDD3. The other ends of the transistor TRIO to TR13 are connected to the select gate lines SGD0 to SGD3.

With the above configuration, the row decoder module 15 can select the block BLK for executing various operations.

Specifically, during various operations, the block decoder BD corresponding to the selected block BLK applies a voltage of "H" level to the transfer gate line TG, and the block decoder BD corresponding to the non-selected block BLK applies a voltage of "L" level to the transfer gate line TG.

In the present specification, the "H" level is a voltage at which the n-channel MOS transistor is turned on and the p-channel MOS transistor is turned off. The "L" level is a voltage at which the n-channel MOS transistor is turned off and the p-channel MOS transistor is turned on.

For example, when the block BLK0 is selected, the transistors TR1 to TR13 in the row decoder RD0 are turned on, and the transistors TR1 to TR13 in the other row decoders RD are turned off. In this case, a current path is formed between the various wirings provided in the block BLK0 and the corresponding signal lines, and the current paths between the various wirings provided in the other blocks BLKs and the corresponding signal lines are cut off.

As a result, the voltage applied to each signal line by the driver module 14 is applied to various wirings provided in the selected block BLK0 via the row decoder RD0. The row decoder module 15 can operate in the same manner even when another block BLK is selected.

[1-1-5] Circuit Configuration of Sense Amplifier Module 16

Figure 10:
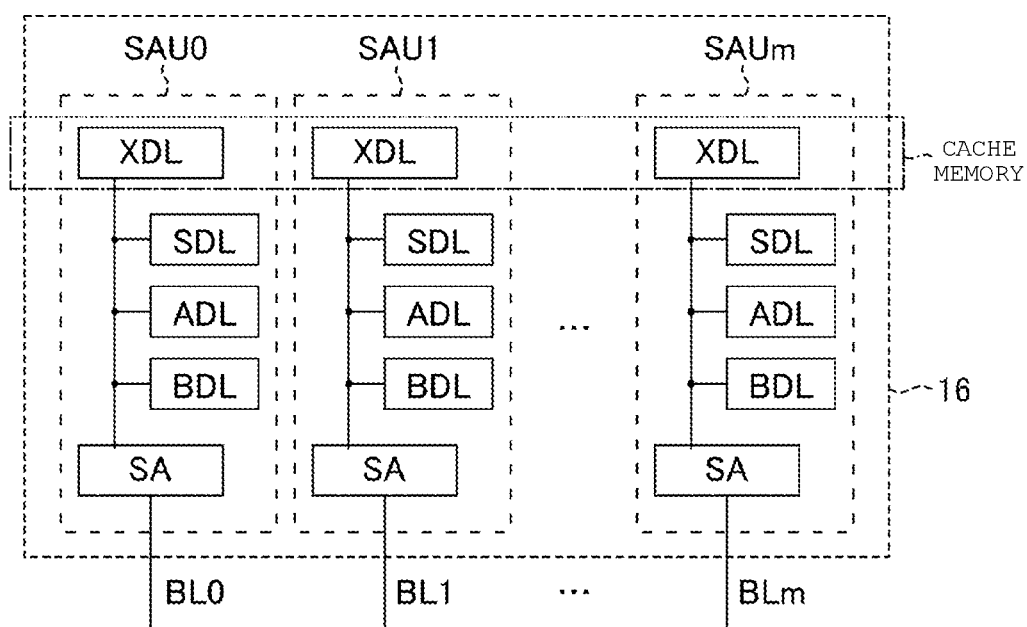
FIG. 10 is a circuit diagram illustrating an example of a circuit configuration of a sense amplifier module in the semiconductor memory according to the first embodiment.

FIG. 10 illustrates an example of a circuit configuration of the sense amplifier module 16 in the semiconductor memory 1 according to the first embodiment.

As illustrated in FIG. 10, the sense amplifier module 16 includes, for example, sense amplifier units SAU0 to SAUm. The sense amplifier units SAU0 to SAUm are respectively associated with bit lines BL0 to BLm.

Each sense amplifier unit SAU includes, for example, sense amplifier unit SA, and latch circuits SDL, ADL, BDL, and XDL. The sense amplifier unit SA, and the latch circuits SDL, ADL, BDL, and XDL are connected so as to be able to transmit and receive data to and from each other.

In a read operation, for example, the sense amplifier unit SA determines whether the read data is "0" or "1", based on the voltage of the corresponding bit line BL. In other words, the sense amplifier unit SA senses the data read out to the corresponding bit line BL and determines the data to be stored in the selected memory cell.

Each of the latch circuits SDL, ADL, BDL, and XDL temporarily stores read data, write data, and the like. The latch circuit XDL is connected to an input/output circuit (not shown), and may be used for data input/output between the sense amplifier unit SAU and the input/output circuit.

The latch circuit XDL can also function as a cache memory of the semiconductor memory 1. For example, even if the latch circuits SDL, ADL, and BDL are in use, if the latch circuit XDL is empty, the semiconductor memory 1 can be in a ready state.

Figure 11:
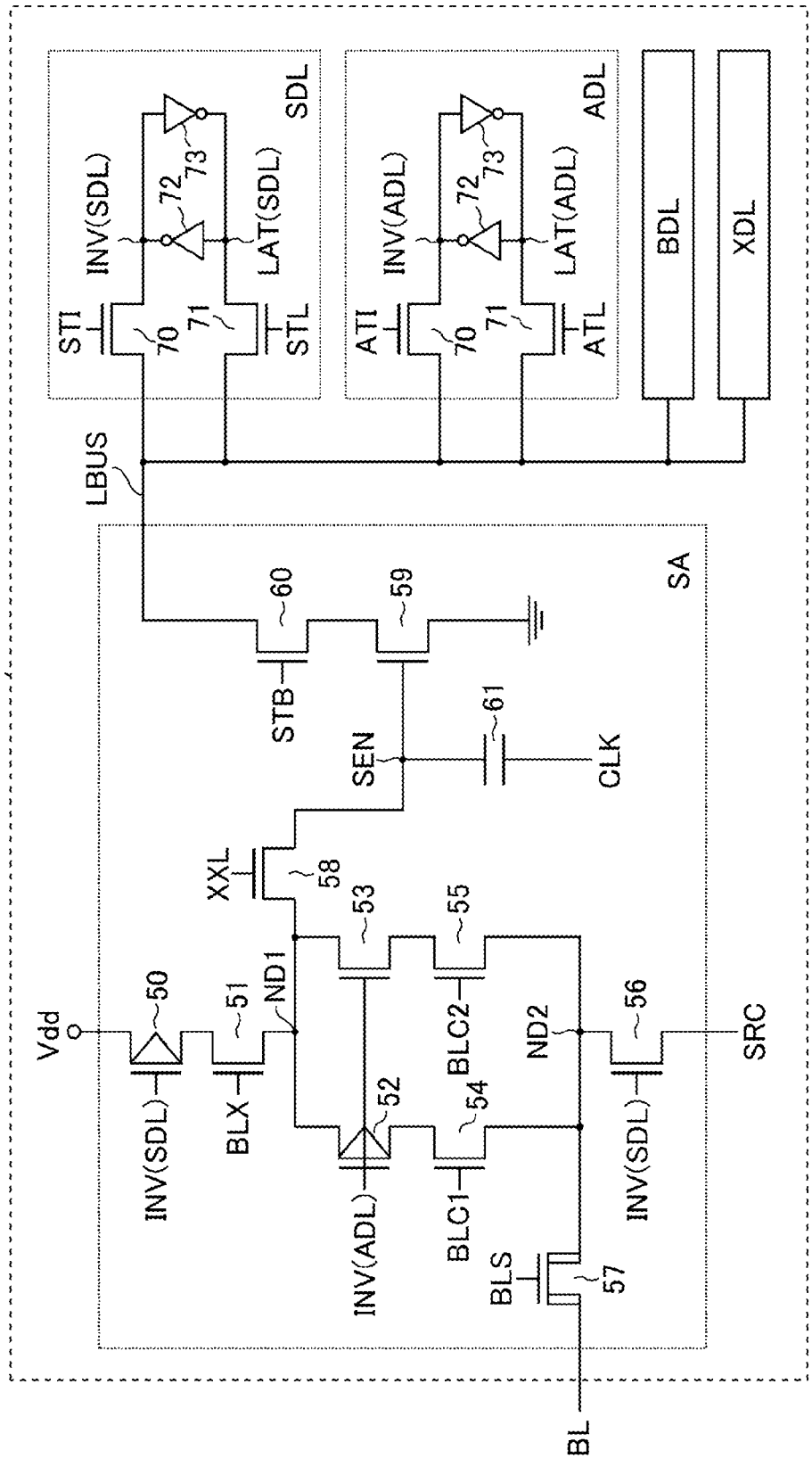
FIG. 11 is a circuit diagram illustrating an example of a more detailed circuit configuration of the sense amplifier module in the semiconductor memory according to the first embodiment.

FIG. 11 illustrates an example of a more detailed circuit configuration of the sense amplifier module 16 in the semiconductor memory according to the first embodiment.

As illustrated in FIG. 11, the sense amplifier unit SA includes, for example, transistors 50 to 60, and a capacitor 61. The latch circuit SDL includes, for example, transistors 70 and 71, and inverters 72 and 73.

For example, each of the transistors 50 and 52 is a p channel MOS transistor. Each of the transistors 51, 53 to 56, 58 to 60, 70, and 71 is an n-channel MOS transistor. The transistor 57 is a high breakdown voltage n-channel MOS transistor.

One end of the transistor 50 is connected to a power supply line. The gate of the transistor 50 is connected to the node INV (SDL) of the latch circuit SDL. For example, the power supply voltage Vdd is applied to the power supply line connected to one end of the transistor 50.

One end of the transistor 51 is connected to the other end of the transistor 50. The other end of the transistor 51 is connected to the node ND1. A control signal BLX is input to the gate of the transistor 51.

One end of each of the transistors 52 and 53 is connected to the node ND1. The gate of each of the transistors 52 and 53 is connected to the node INV (ADL) of the latch circuit ADL.

One ends of the transistors 54 and 55 are connected to the other ends of the transistors 52 and 53, respectively. The other end of each of the transistors 54 and 55 is connected to the node ND2. Control signals BLC1 and BLC2 are input to the gates of the transistors 54 and 55, respectively.

One end of the transistor 56 is connected to the node ND2. The other end of the transistor 56 is connected to the node SRC. The gate of the transistor 56 is connected to the node INV (SDL) of the latch circuit SDL. For example, the ground voltage VSS is applied to the node SRC.

One end of the transistor 57 is connected to the node ND2. The other end of the transistor 57 is connected to the corresponding bit line BL. A control signal BLS is input to the gate of the transistor 57.

One end of the transistor 58 is connected to the node ND1. The other end of the transistor 58 is connected to the node SEN. A control signal XXL is input to the gate of the transistor 58. One end of the transistor 59 is grounded. The gate of transistor 59 is connected to the node SEN.

One end of the transistor 60 is connected to the other end of the transistor 59. The other end of the transistor 60 is connected to the bus LBUS. A control signal STB is input to the gate of the transistor 60. One end of the capacitor 61 is connected to the node SEN. A clock CLK is input to the other end of the capacitor 61.

In the latch circuit SDL, one end of each of the transistors 70 and 71 is connected to the bus LBUS. The other ends of the transistors 70 and 71 are connected to the nodes INV and LAT, respectively. Control signals STI and STL are input to the gates of the transistors 70 and 71, respectively.

The input node of the inverter 72 and the output node of the inverter 73 are connected to the node LAT. The output node of the inverter 72 and the input node of the inverter 73 are connected to the node INV.

The circuit configurations of the latch circuits ADL, BDL, and XDL are the same as the circuit configuration of the latch circuit SDL, for example. For example, in the latch circuit ADL, control signals ATI and ATL are input to the gates of transistors 70 and 71, respectively. In each of the latch circuits BDL and XDL, a control signal different from that of the latch circuit SDL is input to each of the transistors 70 and 71. Further, the nodes INV and LAT of each of the latch circuits SDL, ADL, BDL, and XDL are separately provided for each latch circuit.

Each of the control signals BLX, BLC1, BLC2, BLS, XXL, STB, STI, STL, ATI, and ATL described above is generated by, for example, the sequencer 13. For example, the sequencer 13 can control the latch circuits SDL, ADL, BDL, and XDL, separately.

The timing at which the sense amplifier unit SA determines the data read out to the bit line BL is based on the timing at which the sequencer 13 asserts the control signal STB. In the following description, "assert the control signal STB" corresponds to temporary change of control signal STB from "L" level to "H" level by the sequencer 13.

[1-1-6] Data Allocation

Figure 12:
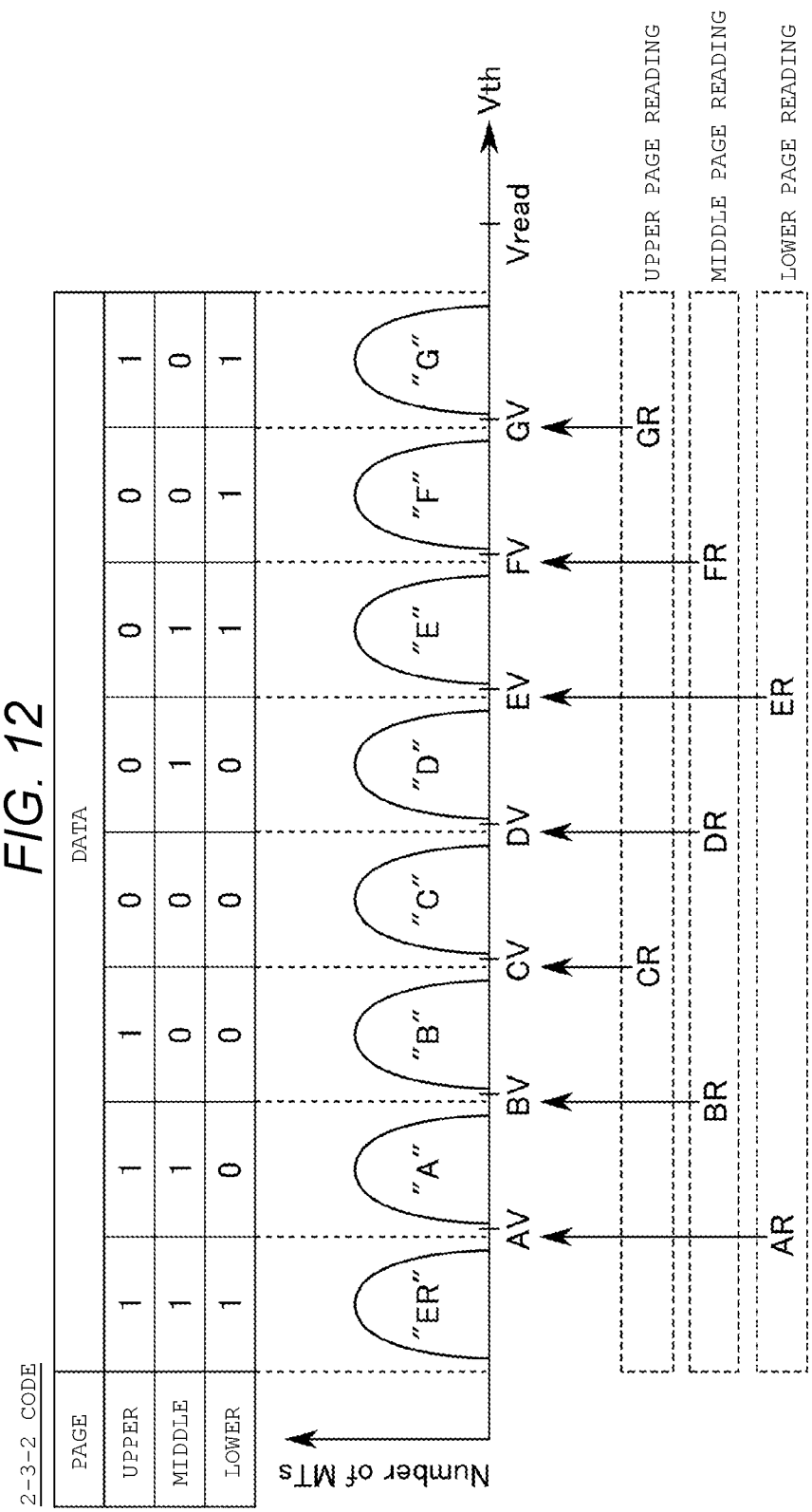
FIG. 12 is a diagram illustrating an example of threshold voltage distribution, data allocation, and read voltage of a memory cell transistor in the semiconductor memory according to the first embodiment.

FIG. 12 illustrates an example of threshold voltage distribution, a read voltage, and a verify voltage of the memory cell transistor MT in the semiconductor memory 1 according to the first embodiment. The vertical axis of the threshold voltage distribution shown in FIG. 12 corresponds to the number of memory cell transistors MT, and the horizontal axis corresponds to the threshold voltage Vth of the memory cell transistor MT.

As illustrated in FIG. 12, in the semiconductor memory 1 according to the first embodiment, for example, eight types of threshold voltage distribution are formed by the threshold voltages of the plurality of memory cell transistors MT in one cell unit CU.

In the present specification, the eight types of threshold voltage distributions (corresponding to write levels) are respectively referred to as "ER" level, "A" level, "B" level, "C" level, "D" level, "E" level, "F" level, and "G" level, in order from the lowest threshold voltage.

Between adjacent threshold voltage distributions, a read voltage to be used in each read operation is set. For example, a read voltage AR is set between a maximum threshold voltage at "ER" level and a minimum threshold voltage at "A" level.

Similarly, a read voltage BR is set between "A" level and "B" level. A read voltage CR is set between "B" level and "C" level. A read voltage DR is set between "C" level and "D" level. A read voltage ER is set between "D" level and "E" level. A read voltage FR is set between "E" level and "F" level. A read voltage GR is set between "F" level and "G" level.

For example, when the read voltage AR is applied to the gate, the memory cell transistor MT is turned on when the threshold voltage thereof is at "ER" level, and the memory cell transistor MT is turned off when the threshold voltage thereof is at "A" level or higher.

Similarly, when the read voltage BR is applied to the gate, the memory cell transistor MT is turned on when the threshold voltage thereof is at "A" level or lower, and the memory cell transistor MT is turned off when the threshold voltage thereof is at "B" level or higher. Even when another read voltage is applied to the gate, the memory cell transistor MT is turned on or off according to the threshold voltage.

A read pass voltage Vread is set at a voltage higher than the highest threshold voltage distribution. Specifically, the read pass voltage Vread is set to a voltage higher than the maximum threshold voltage at the "G" level. When the read pass voltage Vread is applied to the gate, the memory cell transistor MT is turned on irrespective of data stored therein.

Further, between adjacent threshold voltage distributions, a verify voltage to be used in each write operation is set. Specifically, verify voltages AV, BV, CV, DV, EV, FV, and GV are set corresponding to "A" level, "B" level, "C" level, "D" level, "E" level, "F" level, and "G" level, respectively.

The verify voltage AV is set between the maximum threshold voltage at the "ER" level and the minimum threshold voltage at the "A" level and in the vicinity of the "A" level. The verify voltage BV is set between the maximum threshold voltage at the "A" level and the minimum threshold voltage at the "B" level and in the vicinity of the "B" level. Similarly, other verify voltages are set in the vicinity of the corresponding write level. That is, the verify voltages AV, BV, CV, DV, EV, FV, and GV are set to voltages slightly higher than the read voltages AR, BR, CR, DR, ER, FR, and GR, respectively.

In the write operation, when the semiconductor memory 1 detects that the threshold voltage of the memory cell transistor MT which stores certain data exceeds the verify voltage corresponding to the data, the semiconductor memory 1 completes the program of the memory cell transistor MT.

Different pieces of 3-bit data are allocated to the eight types of threshold voltage distribution of the memory cell transistor MT described above. Below is an example of data allocation for threshold voltage distribution.

"ER" level: "111 (upper bit/middle bit/lower bit)" data
"A" level: "110" data
"B" level: "100" data
"C" level: "000" data
"D" level: "010" data
"E" level: "011" data
"F" level: "001" data
"G" level: "101" data.

When such data allocation is applied, one page data made up of lower bits (lower page data) is determined by a read process using read voltages AR, and ER. One page data made up of middle bits (middle page data) is determined by a read process using read voltages BR, DR, and FR. One page data made up of upper bits is determined by a read process using read voltages CR and GR.

That is, the lower page data, the middle page data, and the upper page data are determined by the read process using two types, three types, and two types of read voltages, respectively. Such allocation of data is referred to as "2-3-2 code", for example. In the present specification, a case where the "2-3-2code" is applied to data allocation of the memory cell transistor MT will be described as an example.

[1-2] Read Operation of Semiconductor Memory 1

In the semiconductor memory 1 according to the first embodiment, in the read operation, the bit line BL that executes a kick operation and the bit line BL that does not execute the kick operation coexist.

The kick operation is a voltage applying method of temporarily setting the driving voltage of the driver module 14 to a value higher than the target voltage value, and lowering the voltage to the target voltage value after elapse of a fixed time. The kick operation is executed for the signal line CG and the control signal BLC, for example.

For example, when the kick operation is executed for the signal line CG, the voltage at the far end of the word line WL can reach the target voltage value quickly. When the kick operation is executed for the control signal BLC, the amount of current supplied to the bit line BL by the transistor to which the control signal BLC is input at the gate to charge the bit line BL is increased.

Execution of the kick operation for the signal line CG is equivalent to execution of a kick operation for the word line WL. Execution of the kick operation for the control signal BLC is equivalent to execution of a kick operation for the bit line BL.

Therefore, in the present specification, the kick operation for the signal line CG is also referred to as a kick operation for the word line WL. The kick operation for the control signal BLC is also referred to as a kick operation for the bit line BL.

Further, in the following description, a voltage higher than the target voltage to be applied during the kick operation before the target voltage is applied is referred to as a kick voltage. A difference between the target voltage and the kick voltage in the kick operation is also referred to as a kick amount. The memory cell transistor MT in the cell unit CU to be read is also referred to as a selected memory cell. The word line WL connected to the selected memory cell is referred to as a selected word line WLsel. The signal line CG connected to the selected word line WLsel is referred to as a selected signal line CGsel.

An example of the read operation of the semiconductor memory 1 according to the first embodiment described below is a read operation of the lower page data.

Figure 13:
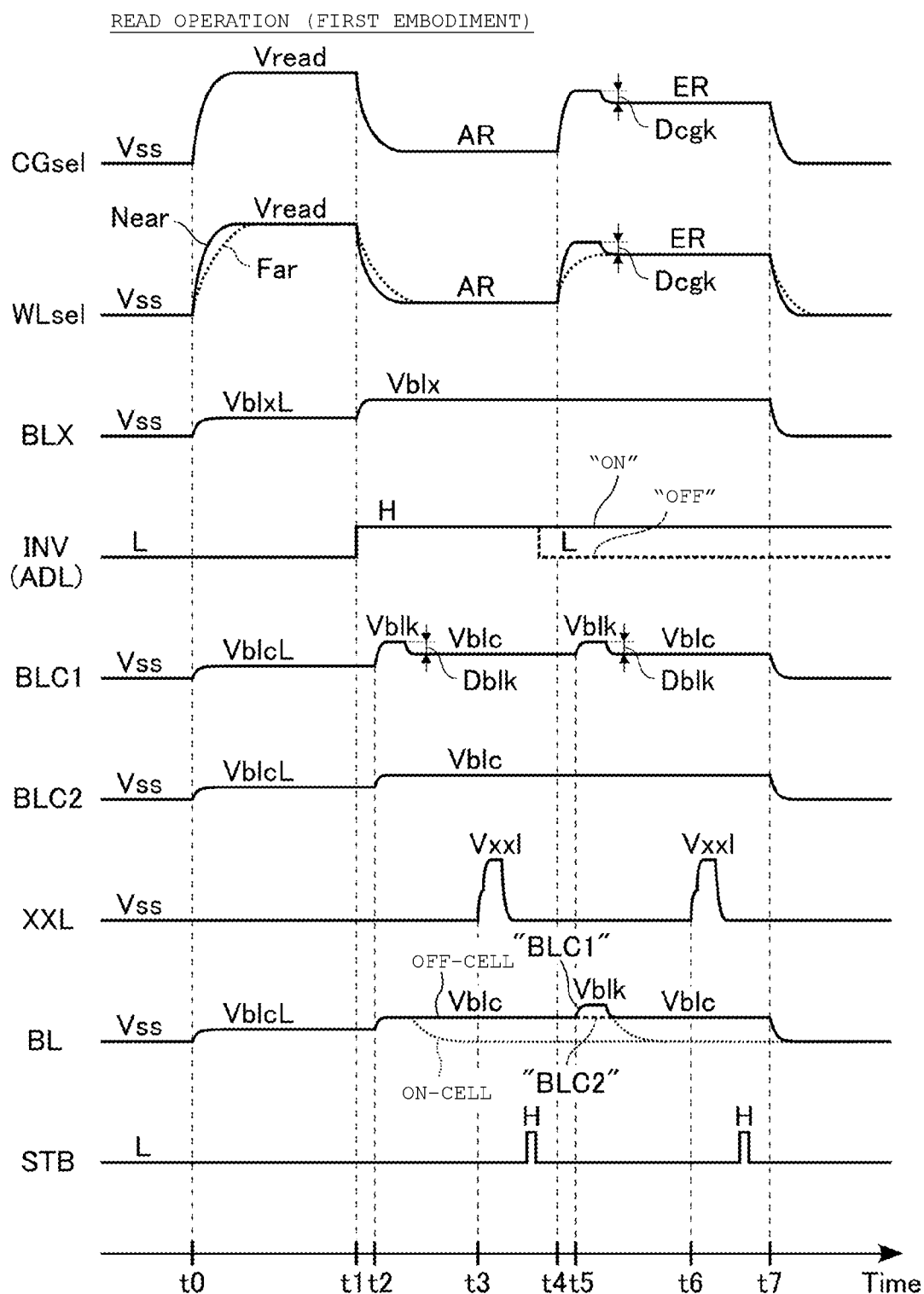
FIG. 13 is a timing chart illustrating an example of a read operation of the semiconductor memory according to the first embodiment.

FIG. 13 illustrates an example of a timing chart in the read operation of the lower page data in the semiconductor memory 1 according to the first embodiment.

In the read operation described below, a voltage is applied to the selected signal line CGsel by the driver module 14 and the row decoder module 15. It is assumed that the node SEN is appropriately charged during a period in which each read voltage is applied.

The timing chart of FIG. 13 indicates the voltage of the bit line BL. The voltage of the bit line BL corresponds to the voltage applied to the gate of the transistor for clamping the voltage of the bit line BL minus the threshold voltage of this transistor.

Further, it is assumed that the voltage of the node INV (SDL) of the latch circuit SDL is set to "L" level. That is, during the period in which the read operation is executed, the transistor 50 is in an on state and supplies the voltage to the transistor 51. Further, the transistor 56 is in an off state and cuts off the current path between the nodes ND2 and SRC.

As illustrated in FIG. 13, at the start of the read operation, the respective voltages of the selected signal line CGsel, the selected word line WLsel, the control signals BLX, BLC1, BLC2, and XXL, and the bit line BL are, for example, a ground voltage Vss. The respective voltages of the node INV (ADL) and the control signal STB are, for example, "L" level.

When the voltage of the node INV (ADL) is "L" level, the transistor 52 is turned on and the transistor 53 is turned off. That is, the current path between the nodes ND1 and ND2 is set as a path through the transistors 52 and 54.

When the read operation of the lower page data is started, the sequencer 13 executes an operation of removing residual electrons in the channel, for example, in the period from the time t0 to the time t1. In the period from the time t1 to the time t4, the sequencer 13 executes a read process using the read voltage AR. In the period from the time t4 to the time t7, the sequencer 13 executes a read process using the read voltage ER.

Specifically, at time t0, for example, the read pass voltage Vread is applied to the selected signal line CGsel together with the non-selected signal lines. Then, the voltage of the selected word line WLsel rises based on the voltage applied to the selected signal line CGsel. At the same time, although not shown in FIG. 13, the voltages of the non-selected word lines rises based on the voltages applied to the non-selected signal lines.

For example, the voltage ("Near" in FIG. 13) at the near end of the selected word line WLsel rises to the read pass voltage Vread, similarly to the selected signal line CGsel, and the voltage ("Far" in FIG. 13) at the far end of the selected word line WLsel is delayed from the selected signal line CGsel, and rises to the read pass voltage Vread.

Further, at time t0, for example, the sequencer 13 raises the voltage of the control signal BLX from Vss to VblxL, and raises the respective voltages of the control signals BLC1 and BLC2 from Vss to VblcL. The voltage value VblcL is, for example, lower than VblxL.

At this time, since the voltage of the node INV (ADL) is "L" level, the voltage clamped by the transistors 52 and 54 is applied to the bit line BL. Then, the voltage of the bit line BL rises from Vss to VblcL, similarly to the control signal BLC1, for example.

When the voltage of the selected word line WLsel rises to Vread and the respective voltages of the control signals BLC1 and BLC2 rise from Vss to VblcL, the transistors in the NAND string NS are turned on, and residual electrons in the channel of the NAND string NS are removed.

Next, at time t1, the read voltage AR is applied to the selected signal line CGsel. Then, the voltage of the selected word line WLsel falls based on the voltage applied to the selected signal line CGsel. Specifically, for example, the voltage at the near end of the selected word line WLsel falls to the read voltage AR similarly to the selected signal line CGsel, and the voltage at the far end of the selected word line WLsel falls to the read voltage AR, with a delay from the selected signal line CGsel.

Further, at time t1, the sequencer 13 raises the voltage of the control signal BLX, for example, from VblxL to Vblx, and sets the voltage of the node INV (ADL) to "H" level. Then, the voltage at the node ND1 rises to the voltage clamped by the transistor 51. When the voltage of the node INV (ADL) is "H" level, the transistor 52 is turned off, and the transistor 53 is turned on. That is, a current path between the nodes ND1 and ND2 is set to a path through the transistors 53 and 55, and a voltage based on the control signal BLC2, for example, is applied to the bit line BL.

Next, at time t2, the sequencer 13 raises the voltages of the control signals BLC1 and BLC2 from VblcL to Vblc. At this time, the sequencer 13 executes a kick operation for the control signal BLC1. The voltage value Vblc is, for example, lower than Vblx.

Specifically, the kick voltage Vblk is first applied to the signal line to which the control signal BLC1 is supplied, and Vblc is applied after the kick voltage Vblk is applied for a short time. The kick voltage Vblk is higher than Vblc, and the difference between Vblk and Vblc corresponds to the kick amount Dblk.

Since the voltage of the node INV (ADL) is "H" level at the time t2, the voltage clamped by the transistors 53 and 55 is applied to the bit line BL. As a result, the voltage of the bit line BL is controlled by the control signal BLC2 to rise to a voltage based on Vblc. As the transistor 52 is turned off, a voltage based on the kick voltage Vblk is prevented from being applied to the bit line.

Further, while the read voltage AR is applied to the selected word line WLsel, the voltage of the bit line BL changes according to the state of the selected memory cell. Specifically, the selected memory cell is turned on or off according to the threshold voltage and read voltage.

For example, when the selected memory cell is in an on state, the voltage of the bit line BL falls below the voltage of the bit line BL of the off-cell (on-cell in FIG. 13). When the selected memory cell is in an off state, the voltage of the bit line BL maintains the voltage based on Vblc (off-cell in FIG. 13).

Next, at time t3, the sequencer 13 raises the voltage of the control signal XXL from Vss to Vxxl. When the voltage of the control signal XXL rises to Vxxl, the transistor 58 is turned on. Then, the voltage of the node SEN changes according to the voltage of the bit line BL.

Then, after the voltage of the bit line BL is reflected on the node SEN, the sequencer 13 lowers the voltage of the control signal XXL from Vxxl to Vss. When the voltage of the control signal XXL falls to Vss, the transistor 58 is turned off and the voltage of the node SEN is fixed.

Thereafter, the sequencer 13 asserts the control signal STB and determines the data to be stored in the selected memory cell. Specifically, the sense amplifier unit SAU determines whether or not the threshold voltage of the corresponding selected memory cell is equal to or higher than the read voltage AR, and stores the determination result in the latch circuit BDL, for example.

Then, the sequencer 13 changes the voltage of the node INV (ADL) in the latch circuit ADL, based on the data retained in the latch circuit BDL. In other words, the sequencer 13 sets the current path between the nodes ND1 and ND2, based on the read result according to the read voltage AR.

For example, when the latch circuit BDL stores data corresponding to the off-cell, the sequencer 13 sets the voltage of the node INV (ADL) to "L" level. When the latch circuit BDL stores data corresponding to the on-cell, the sequencer 13 sets the voltage of the node INV (ADL) to "H" level.

That is, in the sense amplifier unit SAU corresponding to the selected memory cell in which the off state is maintained by the read voltage AR, the current path between the nodes ND1 and ND2 is set as a path through the transistors 52 and 54. In the sense amplifier unit SAU corresponding to the selected memory cell which is turned on by the read voltage AR, the current path between the nodes ND1 and ND2 is set as a path through the transistors 53 and 55.

Next, at time t4, the read voltage ER is applied to the selected signal line CGsel. At this time, the sequencer 13 executes a kick operation for the selected signal line CGsel. Specifically, the kick voltage is applied to the selected signal line CGsel for a short time before the read voltage ER is applied. The kick voltage for the selected signal line CGsel corresponds to the voltage obtained by adding the kick amount Dcgk for the selected signal line CGsel to the target read voltage, for example.

Then, the voltage of the selected word line WLsel rises based on the voltage applied to the selected signal line CGsel. Specifically, for example, the voltage at the near end of the selected word line WLsel reaches the read voltage ER after the kick voltage is applied, similarly to the selected signal line CGsel. The voltage at the far end of the selected word line WLsel reaches the read voltage ER without exceeding the read voltage ER due to the influence of the RC delay of the wiring, for example.

Next, at time t5, the sequencer executes a kick operation for the control signal BLC1. Specifically, the kick voltage Vblk is first applied to the signal line to which the control signal BLC1 is supplied, and Vblc is applied after the kick voltage Vblk is applied for a short time.

Since the voltage of the node INV (ADL) is "L" level at the time t5, the voltage clamped by the transistors 52 and 54 is applied to the bit line BL. Then, the voltage of the bit line BL changes to a voltage based on Vblc ("BLC1" in FIG. 13), after a voltage based on the kick voltage Vblk is applied for a short time, corresponding to the control signal BLC1, for example.

Since the voltage of the node INV (ADL) is "H" level at the time t5, the voltage clamped by the transistors 53 and 55 is applied to the bit line BL. Then, the voltage of the bit line BL maintains a voltage based on the Vblc, corresponding to the control signal BLC2, for example ("BLC2" in FIG. 13).

Thereafter, the voltage of the bit line BL changes depending on the state of the selected memory cell to which the read voltage ER is applied. Since the voltage change of the bit line BL is the same as the readout process by the read voltage AR described at the time t2, its description will be omitted.

Next, at time t6, the sequencer 13 raises the voltage of the control signal XXL from Vss to Vxxl. When the voltage of the control signal XXL rises to Vxxl, the transistor 58 is turned on. Then, the voltage of the node SEN changes according to the voltage of the bit line BL.

Then, after the voltage of the bit line BL is reflected on the node SEN, the sequencer 13 lowers the voltage of the control signal XXL from Vxxl to Vss. When the voltage of the control signal XXL falls to Vss, the transistor 58 is turned off and the voltage of the node SEN is fixed.

Thereafter, the sequencer 13 asserts the control signal STB and determines the data to be stored in the selected memory cell. Specifically, the sense amplifier unit SAU determines whether or not the threshold voltage of the corresponding selected memory cell is equal to or higher than the read voltage ER.

Then, the sequencer 13 determines the lower page data based on the determination result and the read result based on the read voltage AR stored in the latch circuit BDL, and supplies the determined lower page data to, for example, the latch circuit XDL.

Next, at time t7, the sequencer 13 returns each of the selected signal line CGsel, and the control signals BLX, BLC1, BLC2, and XXL to the state before the read operation, and finishes the read operation of the lower page data. When the memory controller 2 detects that the semiconductor memory 1 completes the read operation of the lower page data, the memory controller 2 causes the semiconductor memory 1 to output the lower page data.

As described above, the semiconductor memory 1 according to the first embodiment can execute the read operation of the lower page data. Incidentally, in the semiconductor memory 1 according to the first embodiment, in the read operation of each of the middle page data and the upper page data, similarly to the read operation of the lower page data, the kick operation can be appropriately executed according to the read result.

[1-3] Effect of First Embodiment

In the semiconductor memory 1 according to the first embodiment described above, it is possible to speed up the read operation of the semiconductor memory 1. The effect of the semiconductor memory 1 according to the first embodiment will be described in detail below.

In a semiconductor memory in which memory cells are three-dimensionally stacked, a conductor (e.g., word line WL) used as a gate electrode of a memory cell and an interlayer insulating film are alternately stacked, so a volume increase is achieved by increasing the number of stacked layers.

The stacked word lines WL are drawn in a stepwise shape, for example, at the end portion of the memory cell array, and a voltage is applied via the contacts connected to the terrace portions of the formed staircase. However, the word line WL having such a structure tends to have a large RC delay when a voltage is applied.

For example, it may be assumed that the rising speed of the voltage is different between an area close to the driver (near end of the word line WL) and an area far from the driver (far end of the word line WL), and the voltage at the far end of the word line WL reaches a target voltage with a delay greater than the voltage at the near end of the word line WL.

Therefore, in the semiconductor memory, for example, in order to assist the voltage rise at the far end of the word line WL, the kick operation for the word line WL is executed. When the kick operation for the word line WL is executed, the voltage at the far end of the word line WL reaches the target voltage earlier than when the kick operation is not executed.

However, when the kick operation for the word line WL is executed, overdischarge occurs in the bit line BL connected to the NAND string NS corresponding to the near end portion of the word line WL, and time for stabilizing the voltage of the bit line BL may be prolonged.

In addition, as described above, the voltage of the selected word line WLsel is raised to the read pass voltage Vread at the start of the read operation in order to remove residual electrons in the channel of the NAND string NS, and then is caused to fall toward the read voltage AR. As the falling speed of the voltage is different between the area close to the driver (near end of the word line WL) and the area far from the driver (far end of the word line WL), and the voltage remains larger at the far end of the word line WL as compared with the voltage at the near end of the word line WL. As a result, overdischarge occurs in the bit line BL connected to the NAND string NS corresponding to the far end portion of the word line WL, and time for stabilizing the voltage of the bit line BL may be prolonged.

In the other words, overdischarge occurs in the bit line BL when the voltage of the word line WL is caused to first overshoot and then fall to its target level.

As a countermeasure against overdischarge of the bit line BL, it is conceivable to charge the bit line BL in which overdischarge occurs by executing the kick operation for the bit line BL. Thus, charging of the overdischarged bit line BL is assisted, and the voltage of the bit line BL can be stabilized in a short time.

Further, it may be assumed that in the kick operation for the bit line BL, the effect changes depending on whether the memory cell to which the read voltage is applied is in the on state or the off state in the read process in which the kick operation is executed.

For example, when the threshold voltage of the memory cell to which the read voltage is applied is larger than the read voltage, when the sequencer 13 reflects the voltage of the bit line BL on the node SEN, the voltage of the bit line BL needs to be a voltage of "H" level. In other words, when the memory cell to which the read voltage is applied is in the off state, it is preferable that the voltage of the bit line BL is maintained in a high state.

That is, in each read process, the bit line BL connected to a memory cell which is turned off (hereinafter, referred to as an off-cell) is greatly affected by overdischarge on the bit line BL, which may cause erroneous reading. Therefore, it is preferable that the kick operation is executed for the bit line BL connected to the memory cell which is clearly turned off.

On the other hand, when the threshold voltage of the memory cell to which the read voltage is applied is the read voltage or less, when the voltage of the bit line BL is reflected on the node SEN, the voltage of the bit line BL needs to be a voltage of "L" level. In other words, when the memory cell to which the read voltage is applied is turned on, it is preferable that the voltage of the bit line BL transitions to a low state.

That is, in each read process, the bit line BL connected to a memory cell which is turned on (hereinafter, referred to as an on-cell) has little influence due to overdischarge on the bit line BL. Therefore, it is preferable that the kick operation is omitted for the bit line BL connected to the memory cell which is clearly turned on.

Further, in each read process, when the kick operation is executed for the bit line BL connected to the on-cell, the variation in the voltage of the bit line BL increases. In this case, it may be assumed that the voltage of the bit line BL adjacent to the bit line BL connected to the on-cell is lowered by capacitive coupling. For example, when the bit line BL connected to the on-cell is adjacent to the bit line BL connected to the off-cell, the voltage of the bit line BL connected to the off-cell is lowered, and erroneous reading is performed on the bit line BL connected to the off-cell may occur.

Therefore, in the semiconductor memory 1 according to the first embodiment, in the read operation, the kick operation for the bit line BL that can be determined to be in an on state in advance is omitted.

This operation may be implemented by the circuit configuration of the sense amplifier unit SAU described with reference to FIG. 11, for example. Specifically, the state of the memory cell transistor MT in the last read process is stored in the node INV (ADL) of the latch circuit ADL, for example.

For example, when the read process is executed in the order of the read voltages AR and ER, it is clear that the memory cell transistor MT which is turned on by the read voltage AR is turned on by the read voltage ER. At this time, the sequencer 13 sets the voltage of the node INV (ADL), for example, to "H" level.

On the other hand, it is not determined whether the memory cell transistor MT which is turned off by the read voltage AR is to be turned on or turned off by the read voltage ER. At this time, the sequencer 13 sets the voltage of the node INV (ADL), for example, to "L" level.

The node INV (ADL) is connected to the gate of the p-channel MOS transistor 52 and the gate of the n-channel MOS transistor 53, for example. The transistor 52 is placed, for example, in a current path in which a kick operation is executed, and the transistor 53 is placed, for example, in a current path in which a kick operation is not executed. That is, one of the transistors 52 and 53 is turned on and the other is turned off, based on the voltage of the node INV (ADL).

Thus, in the semiconductor memory 1 according to the first embodiment, it is possible to selectively omit the kick operation for the bit line BL that can be determined to be in an on state in advance.

As a result, in the semiconductor memory 1 according to the first embodiment, it is possible to prevent erroneous reading caused by performing the kick operation for the bit line BL connected to the on-cell. In the semiconductor memory 1 according to the first embodiment, the stabilization time of the bit line BL can be shortened by appropriately executing the kick operation for the bit line BL, the read operation can be speeded up.

When read voltages are applied in order from the lowest read voltage, it is considered that the number of memory cell transistors MT to be turned on by the read voltage applied first is smaller than the number of memory cell transistors MT to be turned on by the read voltage applied later.

In other words, it may be assumed that the number of off-cells is larger than the number of on-cells, in the read process at the first applied read voltage. Since the number of off-cells is large, it may be assumed that the number of off-cells affected by noise by the bit line BL connected to the on-cell increases.

Therefore, the semiconductor memory 1 according to the first embodiment omits the kick operation for all the bit lines BL, for example, in the first read process. Further, in the semiconductor memory 1 according to the first embodiment, in the second and subsequent read processes, for example, the kick operation is omitted for the bit line BL corresponding to the memory cell transistor MT of which being turned on is clear, similar to the first read process.

Thus, in the semiconductor memory 1 according to the first embodiment, it is possible to reduce the number of error bits and improve the reliability of data.

In the second and subsequent read processes, for example, in a case where the read voltage is higher than the predetermined voltage, it may be assumed that the number of on-cells becomes dominant. Therefore, in the second and subsequent read processes out of the read operations, the sequencer 13 may execute the kick operation for the bit line BL corresponding to the memory cell transistor MT of which being turned on is not clear, according to the read voltage to be applied.

[1-4] Modification Example of First Embodiment

In the semiconductor memory 1 according to the first embodiment described above, the read operation in which read voltages are applied in order from the lowest read voltage is given as an example, but the present disclosure is not limited thereto. For example, the operation described in the first embodiment can be applied, even in the case where the read voltage is applied from the highest read voltage.

Hereinafter, an example of a read operation in the modification example of the first embodiment will be described.

Figure 14:
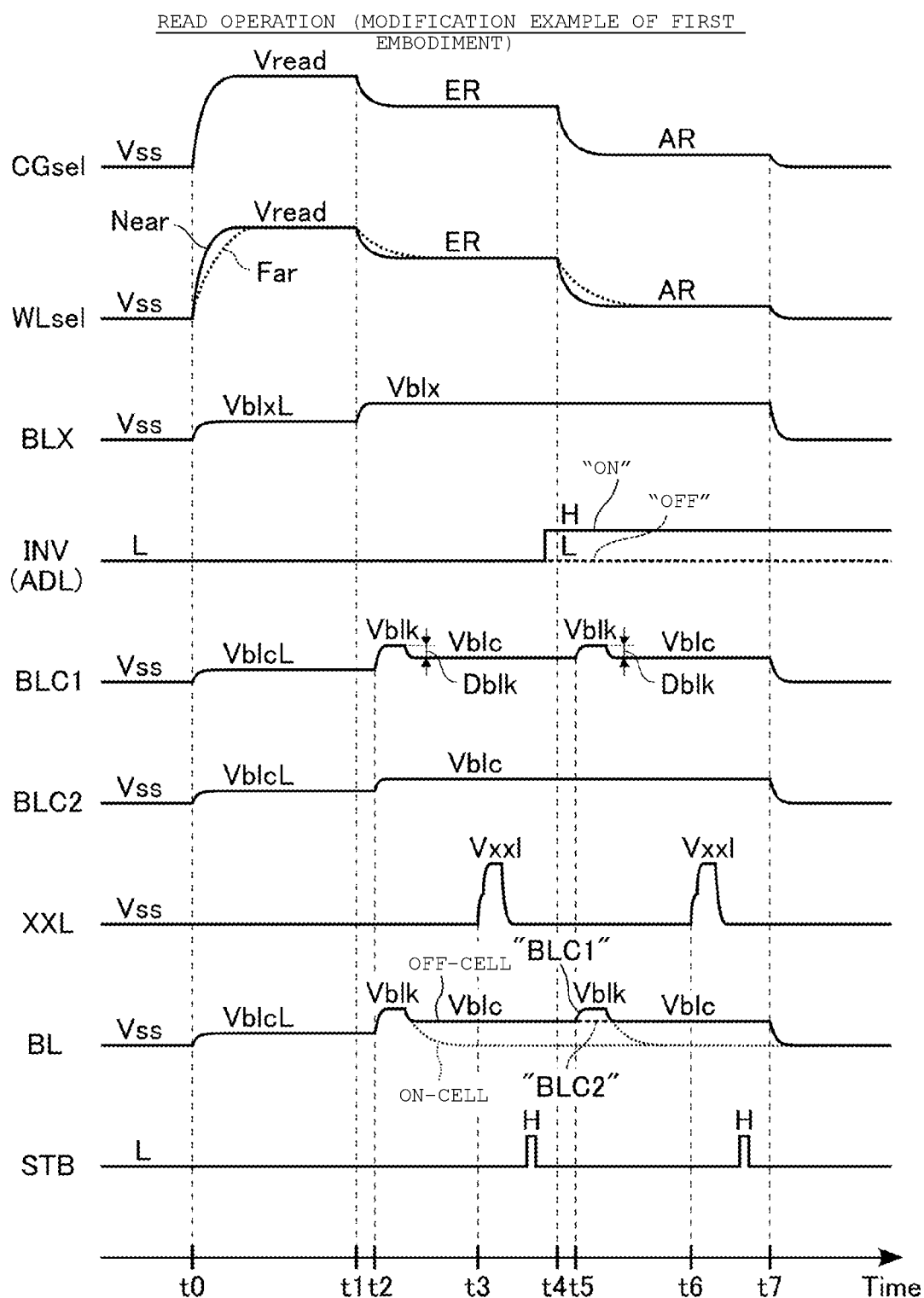
FIG. 14 is a timing chart illustrating an example of a read operation in a modification example of the first embodiment.

FIG. 14 illustrates an example of a timing chart in the read operation of the lower page data in the modification example of the first embodiment.

As illustrated in FIG. 14, in the read operation in the modification example of the first embodiment, the order in which the read voltage is applied is switched for the read operation in the first embodiment described with reference to FIG. 13.

That is, in the read operation of the modification example of the first embodiment, at time t1, the read voltage ER is applied to the selected signal line CGsel. At time t4, the read voltage AR is applied to the selected signal line CGsel. When each read voltage is applied to the selected signal line CGsel, the voltage at the near end ("Near" in FIG. 14) of the selected word line WLsel falls similarly to the selected signal line CGsel, and the voltage at the far end ("Far" in FIG. 14) of the selected word line WLsel falls with a delay from the selected signal line CGsel.

As described above, the voltage of the selected word line WLsel falls from the read pass voltage Vread to the read voltage ER at time t1, and falls from the read voltage ER to the read voltage AR at time t4. In addition, due to the difference in voltage falling speed between the area close to the driver (near end of the word line WL) and the area far from the driver (far end of the word line WL), the voltage remains larger at the far end of the word line WL as compared with the voltage at the near end of the word line WL. As a result, overdischarge occurs in the bit line BL connected to the NAND string NS corresponding to the far end portion of the word line WL, and time for stabilizing the voltage of the bit line BL may be prolonged.

Also in the modification example of the first embodiment, the kick operation for the bit line BL is performed as a countermeasure against overdischarge of the bit line BL.

Specifically, in the read operation in the modification example of the first embodiment, in the first kick operation, the kick operation for all the bit lines BL is executed.

Specifically, at time t1, the sequencer 13 sets the voltage of the node INV (ADL) to "L" level. When the voltage of the node INV (ADL) is "L" level, the transistor 52 is turned on and the transistor 53 is turned off. That is, a current path between the nodes ND1 and ND2 is set to a path through the transistors 52 and 54, and a voltage based on the control signal BLC1, for example, is applied to the bit line BL.

Therefore, at time t2, a voltage corresponding to the control signal BLC1 on which the kick operation is executed is applied to the bit line BL. That is, at time t2, the voltage of the bit line BL changes to a voltage based on Vblc, after a voltage based on the kick voltage Vblk is applied for a short time, corresponding to the control signal BLC1, for example.

Since the other operations of the read operation in the modification example of the first embodiment are similar to the read operation in the first embodiment, a description thereof will be omitted. While the read operation of the lower page data is shown as the modification example of the first embodiment, the same operation may be executed for the read operation of each of the middle page data and the upper page data.

As described above, in the read operation in the modification example of the first embodiment, the kick operation is executed for the bit line BL that can be determined to be in an off state in advance.

For example, in a case where the read process is executed in the order of the read voltages ER and AR, it is clear that the memory cell transistor MT which is turned off by the read voltage ER is turned off by the read voltage AR. At this time, the sequencer 13 sets the voltage of the node INV (ADL), for example, to "L" level.

On the other hand, it is not determined whether the memory cell transistor MT which is turned on by the read voltage ER is to be turned on or turned off by the read voltage AR. At this time, the sequencer 13 sets the voltage of the node INV (ADL), for example, to "H" level.

In the read operation in the modification example of the first embodiment, similarly to the first embodiment, whether or not to execute the kick operation for the bit line BL can be set based on the voltage of the node INV (ADL).

Thus, in the read operation in the modification example of the first embodiment, the kick operation can be selectively executed for the bit line BL that can be determined to be in an off state in advance.

As a result, in the read operation in the modification example of the first embodiment, it is possible to prevent erroneous reading caused by not performing the kick operation for the bit line BL connected to the off-cell. In the read operation in the modification example of the first embodiment, the stabilization time of the bit line BL can be shortened by appropriately executing the kick operation for the bit line BL, and the read operation can be speeded up.

In a case where read voltages are applied in order from the highest read voltage, it is considered that the number of memory cell transistors MT to be turned on by the read voltage applied first is larger than the number of memory cell transistors MT to be turned on by the read voltage applied later.

In other words, it may be assumed that the number of on-cells is larger than the number of off-cells, in the read process at the first applied read voltage. Since the number of on-cells is large, it may be assumed that the number of off-cells affected by noise by the bit line BL connected to the on-cell decreases.

Thus, in the read operation in the modification example of the first embodiment, for example, the first kick operation is executed for all the bit lines BL. Further, in the read operations in the modification example of the first embodiment, in the second and subsequent read processes, for example, the kick operation is executed for the bit line BL corresponding to the memory cell transistor MT of which being turned off is not clear, similar to the first read operation.

Thus, in the read operation in the modification example of the first embodiment, it is possible to reduce the number of error bits and improve the reliability of data.

In the second and subsequent read processes, for example, in a case where the read voltage is lower than the predetermined voltage, it may be assumed that the number of off-cells becomes dominant. Therefore, in the second and subsequent read processes out of the read operations, the sequencer 13 may omit a kick operation for the bit line BL corresponding to the memory cell transistor MT of which being turned off is not clear, according to the read voltage to be applied.

[2] Second Embodiment

A semiconductor memory 1 according to a second embodiment executes a read operation similar to that of the first embodiment, by using a sense amplifier module 16 different from that of the first embodiment. With respect to the semiconductor memory 1 according to the second embodiment, different features from that of the first embodiment will be described below.

[2-1] Circuit Configuration of Sense Amplifier Module 16

Figure 15:
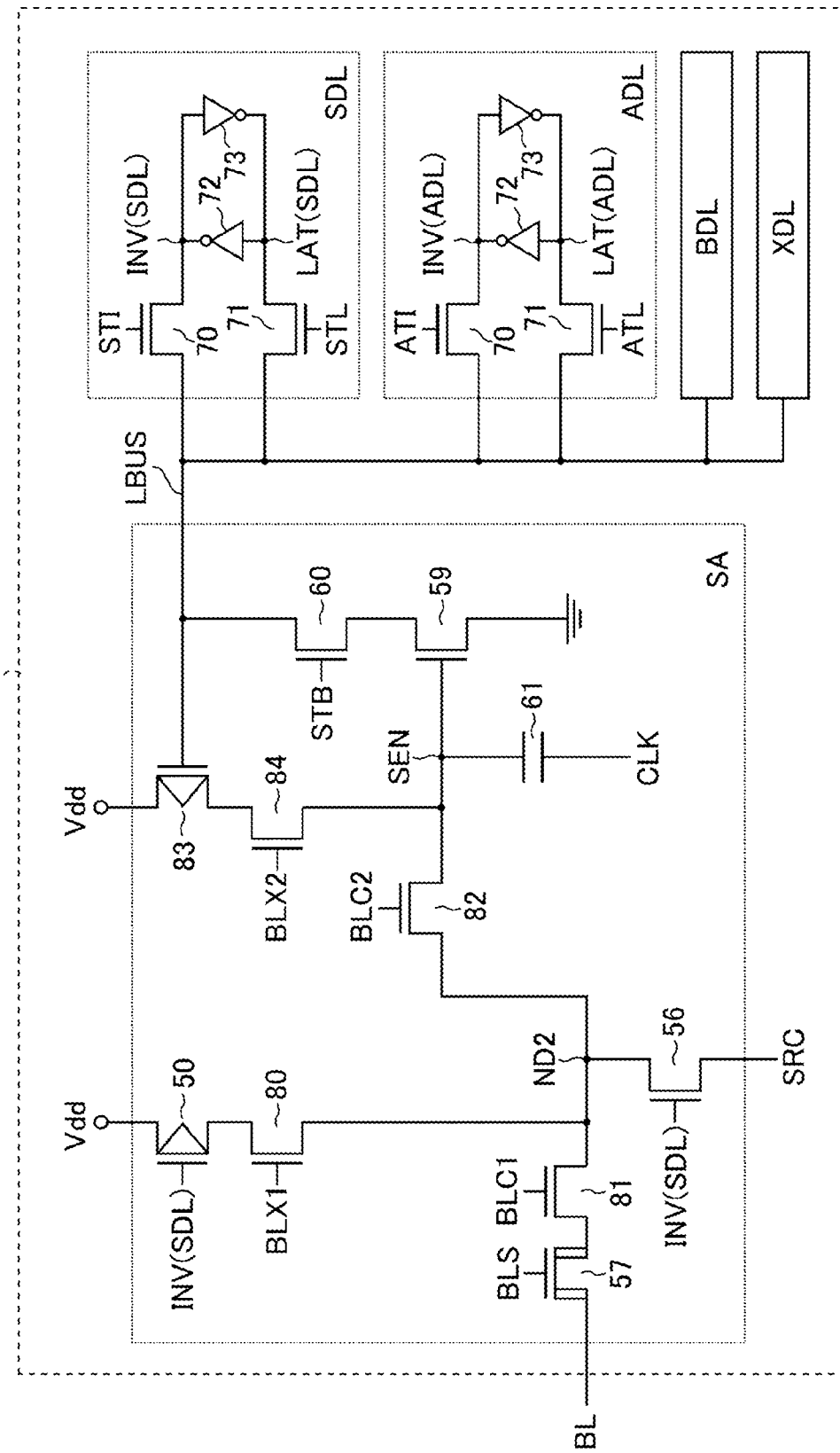
FIG. 15 is a circuit diagram illustrating an example of a circuit configuration of a sense amplifier module in a semiconductor memory according to a second embodiment.

FIG. 15 illustrates an example of the circuit configuration of the sense amplifier module 16 in the semiconductor memory according to the second embodiment, by extracting one sense amplifier unit SAU out of a plurality of sense amplifier units SAU in the sense amplifier module 16.

As illustrated in FIG. 15, a sense amplifier unit SA in the second embodiment has a configuration in which transistors 51 to 55, and 58 are omitted from the sense amplifier unit SA described with reference to FIG. 11 in the first embodiment and transistors 80 to 84 are added thereto.

For example, each of the transistors 80 to 82 and 84 is an n-channel MOS transistor. The transistor 83 is a p-channel MOS transistor.

One end of the transistor 80 is connected to the other end of the transistor 50. The other end of the transistor 80 is connected to the node ND2. A control signal BLX1 is input to the gate of the transistor 80.

The transistor 81 is connected to one end of the transistor 57 and the node ND2. Specifically, one end of the transistor 81 is connected to the node ND2, and the other end of the transistor 81 is connected to one end of the transistor 57. A control signal BLC1 is input to the gate of the transistor 81.

One end of the transistor 82 is connected to the node ND2. The other end of the transistor 82 is connected to the node SEN. A control signal BLC2 is input to the gate of the transistor 82.

One end of the transistor 83 is connected to a power supply line. The gate of the transistor 83 is connected to the bus LBUS. For example, the power supply voltage Vdd is applied to the power supply line connected to one end of the transistor 83.

One end of the transistor 84 is connected to the other end of the transistor 83. The other end of the transistor 84 is connected to the node SEN. A control signal BLX2 is input to the gate of the transistor 84.

Since the other configurations of the semiconductor memory 1 according to the second embodiment are similar to, for example, the semiconductor memory 1 according to the first embodiment, the explanation is omitted.

[2-2] Read Operation of Semiconductor Memory 1

Figure 16:
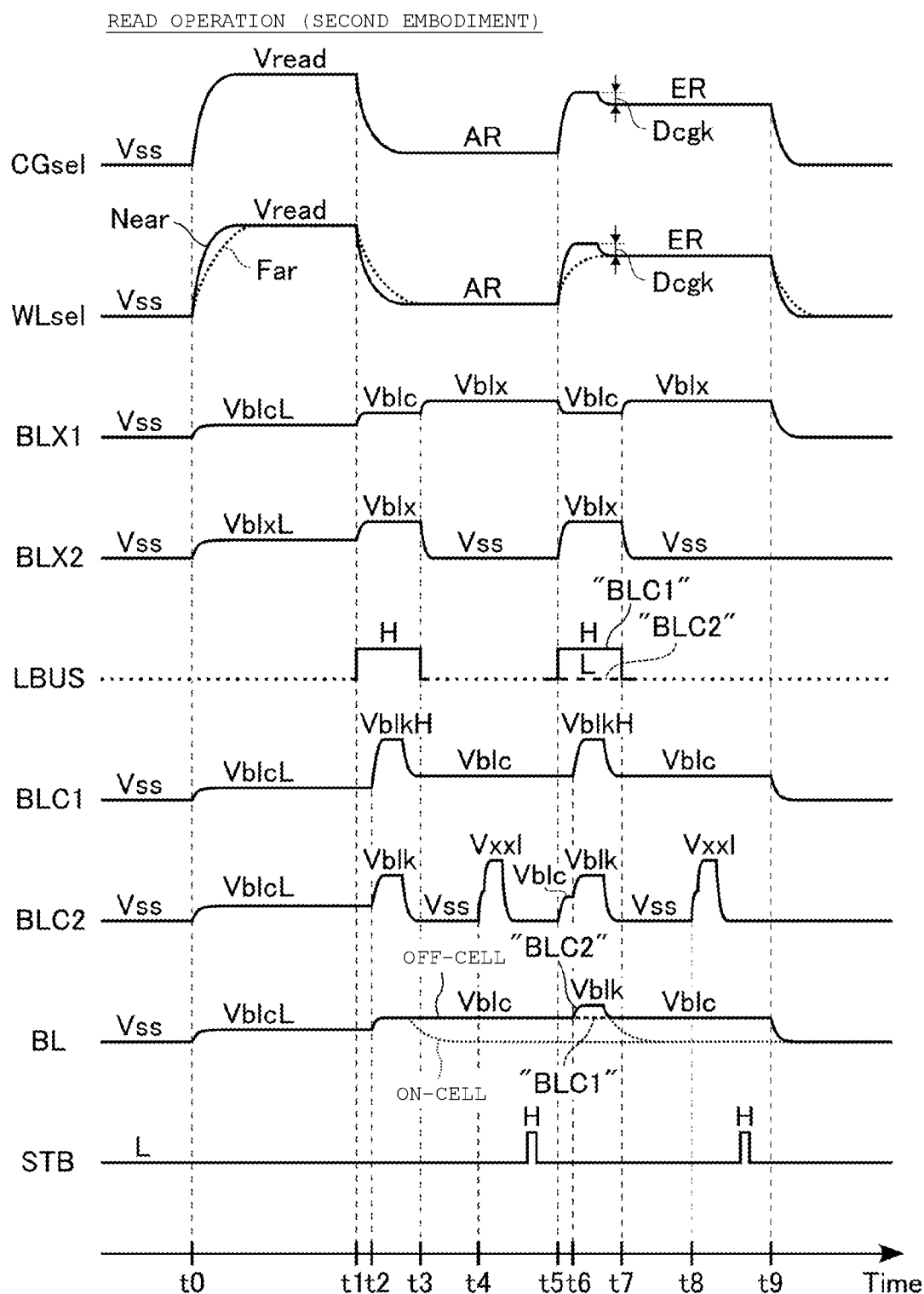
FIG. 16 is a timing chart illustrating an example of a read operation of the semiconductor memory according to the second embodiment.

FIG. 16 illustrates an example of a timing chart in the read operation of the lower page data in the semiconductor memory 1 according to the second embodiment. In the read operation in the second embodiment, it is defined that the transistor 50 is in an on state similarly to the first embodiment and supplies a voltage to the transistor 80.

As illustrated in FIG. 16, at the start of the read operation, the respective voltages of the selected signal line CGsel, the selected word line WLsel, the control signals BLX1, BLX2, BLC1, and BLC2, and the bit line BL are, for example, a ground voltage Vss. The voltage of the control signal STB is, for example, "L" level.

When the read operation of the lower page data is started, the sequencer 13 executes an operation of removing residual electrons in the channel, for example, in the period from the time t0 to the time t1, similarly to the first embodiment. In the period from the time t1 to the time t5, the sequencer 13 executes a read process using the read voltage AR. In the period from the time t5 to the time t9, the sequencer 13 executes a read process using the read voltage ER.

Specifically, at time to, a read pass voltage Vread, for example, is applied to the selected signal line CGsel. Then, the voltage of the selected word line WLsel rises based on the voltage applied to the selected signal line CGsel.

Further, at time t0, for example, the sequencer 13 raises the voltage of each of the control signals BLX1, BLC1, and BLC2 from Vss to VblcL, and raises the voltage of the control signal BLX2 from Vss to VblxL.

At this time, the voltage clamped by the transistors 80 and 81, for example, is applied to the bit line BL. Then, the voltage of the bit line BL rises from Vss to a voltage based on VblcL, for example, corresponding to the control signal BLC1.

Next, at time t1, the read voltage AR is applied to the selected signal line CGsel. Then, the voltage of the selected word line WLsel falls based on the voltage applied to the selected signal line CGsel.

Further, at time t1, the sequencer 13 sets the voltage of the bus LBUS to "H" level, raises the voltage of the control signal BLX1 from VblcL to Vblc, and changes the voltage of the control signal BLX2 from VblxL to Vblx, for example.

When the voltage of the bus LBUS is set to the "H" level, the transistor 83 is turned off, and the supply of the voltage to the transistor 84 is interrupted. Further, the voltage at the node ND2 rises to the voltage clamped by the transistor 80.

Next, at time t2, the sequencer 13 executes the kick operation for each of the control signals BLC1 and BLC2, for example. Specifically, the sequencer 13 raises the voltage of the control signal BLC1 to the kick voltage VblkH, and raises the voltage of the control signal BLC2 to the kick voltage Vblk. The kick voltage VblkH is higher than Vblk.

While the kick operation is executed for each of the control signals BLC1 and BLC2, a voltage due to a path passing through the transistors 50, 80, and 81 is applied to the bit line BL. Then, a voltage based on Vblc is applied to the bit line BL for a short time, corresponding to the control signal BLX1, for example.

Then, the sequencer 13 lowers the voltage of the control signal BLC1 to Vblc and lowers the voltage of the control signal BLC2 to Vss, after performing the kick operation for each of the control signals BLC1 and BLC2. When the voltage of the control signal BLC2 becomes Vss, the transistor 82 is turned off.

Next, at time t3, for example, the sequencer 13 raises the voltage of the control signal BLX1 from Vblc to Vblx, and lowers the voltage of the control signal BLX2 from Vblx to Vss. When the voltage of the control signal BLC2 becomes Vss, the transistor 84 is turned off.

At this time, a voltage due to a path passing through the transistors 50, 80, and 81 is applied to the bit line BL. Then, a voltage based on Vblc is applied to the bit line BL, corresponding to the control signal BLC1, for example.

Further, while the read voltage AR is applied to the selected word line WLsel, the voltage of the bit line BL changes according to the state of the selected memory cell, as in the first embodiment.

Next, at time t4, the sequencer 13 raises the voltage of the control signal BLC2 to Vxxl, for example. When the voltage of the control signal BLC2 rises to Vxxl, the transistor 82 is turned on. Then, the voltage of the node SEN changes according to the voltage of the bit line BL.

Then, after the voltage of the bit line BL is reflected on the node SEN, the sequencer 13 lowers the voltage of the control signal BLC2 to Vss. When the voltage of the control signal XXL falls to Vss, the transistor 82 is turned off and the voltage of the node SEN is fixed.

Thereafter, the sequencer 13 asserts the control signal STB and determines the data to be stored in the selected memory cell. Specifically, the sense amplifier unit SAU determines whether or not the threshold voltage of the corresponding selected memory cell is equal to or higher than the read voltage AR, and stores the determination result in the latch circuit ADL, for example.

Next, at time t5, the read voltage ER is applied to the selected signal line CGsel. At this time, similarly to the first embodiment, the sequencer 13 executes the kick operation for the selected signal line CGsel. Then, similarly to the first embodiment, the voltage of the selected word line WLsel rises, based on the voltage applied to the selected signal line CGsel.

Further, at time t5, for example, the sequencer 13 lowers the voltage of the control signal BLX1 from Vblx to Vblc, raises the voltage of the control signal BLX2 from Vss to Vblx, and raises the voltage of the control signal BLC2 from Vss to Vblc. When the voltage of the control signal BLX2 becomes Vblx, the transistor 84 is turned on. When the voltage of the control signal BLC2 becomes Vblc, the transistor 82 is turned on.

At time t5, the sequencer 13 controls the voltage of the bus LBUS, based on the data stored in the latch circuit ADL. For example, when the latch circuit ADL stores data corresponding to the off-cell, the sequencer 13 sets the voltage of the bus LBUS to "L" level. When the latch circuit ADL stores data corresponding to the on-cell, the sequencer 13 sets the voltage of the bus LBUS to "H" level.

Then, the sense amplifier unit SAU corresponding to the selected memory cell which maintains the off state by the read voltage AR applies a voltage by a path passing through the transistors 50, 80, and 81 and a voltage by a path passing through the transistors 83, 84, 82, and 81, to the corresponding bit line BL, respectively.

The sense amplifier unit SAU corresponding to the selected memory cell turned on by the read voltage AR applies a voltage by a path passing through the transistors 50, 80, and 81. In this way, in the read operation in the second embodiment, the number of paths for applying a voltage to the bit line BL is changed based on the last read result.

Next, at time t6, the sequencer executes the kick operation for each of the control signals BLC1 and BLC2, for example. Specifically, similarly to the time t2, the sequencer 13 raises the voltage of the control signal BLC1 to the kick voltage VblkH, and raises the voltage of the control signal BLC2 to the kick voltage Vblk.

When at time t6, the voltage of the bus LBUS is "H" level, a voltage due to a path passing through the transistors 50, 80, and 81 is applied to the bit line BL. Then, a voltage based on Vblc is applied to the bit line BL, corresponding to the control signal BLX1, for example ("BLC1" in FIG. 16).

When at time t6, the voltage of the bus LBUS is "L" level, a voltage due to a path passing through the transistors 50, 80, and 81 and a voltage due to a path passing through the transistors 83, 84, 82, and 81 are applied to the bit line BL. Then, a voltage based on the kick voltage Vblk is applied to the bit line BL for a short time, corresponding to the control signal BLC2, for example ("BLC2" in FIG. 16).

Next, at time t7, for example, the sequencer 13 raises the voltage of the control signal BLX1 from Vblc to Vblx, and lowers the voltage of the control signal BLX2 from Vblx to Vss. When the voltage of the control signal BLC2 becomes Vss, the transistor 84 is turned off.

At this time, a voltage due to a path passing through the transistors 50, 80, and 81 is applied to the bit line BL. Then, a voltage based on Vblc is applied to the bit line BL, corresponding to the control signal BLC1, for example.

Further, while the read voltage ER is applied to the selected word line WLsel, the voltage of the bit line BL changes according to the state of the selected memory cell, as in the first embodiment.

Next, at time t8, the sequencer 13 raises the voltage of the control signal BLC2 from Vss to Vxxl, for example. When the voltage of the control signal BLC2 rises to Vxxl, the transistor 82 is turned on. Then, the voltage of the node SEN changes according to the voltage of the bit line BL, that is, the state of the selected memory cell.

Then, after the voltage of the bit line BL is reflected on the node SEN, the sequencer 13 lowers the voltage of the control signal BLC2, for example, from Vxxl to Vss. When the voltage of the control signal BLC2 falls to Vss, the transistor 82 is turned off and the voltage of the node SEN is fixed.

Thereafter, the sequencer 13 asserts the control signal STB and determines the data to be stored in the selected memory cell. Specifically, the sense amplifier unit SAU determines whether or not the threshold voltage of the corresponding selected memory cell is equal to or higher than the read voltage ER.

Then, the sequencer 13 determines the lower page data based on the determination result and the read result based on the read voltage AR stored in the latch circuit ADL, and supplies the determined lower page data to, for example, the latch circuit XDL.

Next, at time t9, the sequencer 13 returns each of the selected signal line CGsel, and the control signals BLX1, BLX2, BLC1, and BLC2 to the state before the read operation, and finishes the read operation of the lower page data. When the memory controller 2 detects that the semiconductor memory 1 completes the read operation of the lower page data, the memory controller 2 causes the semiconductor memory 1 to output the lower page data.

As described above, the semiconductor memory 1 according to the second embodiment can execute the read operation of the lower page data. Incidentally, in the semiconductor memory 1 according to the second embodiment, in the read operation of each of the middle page data and the upper page data, similarly to the read operation of the lower page data, the kick operation can be appropriately executed according to the read result.

[2-3] Effect of Second Embodiment

In the semiconductor memory 1 according to the second embodiment, similarly to the first embodiment, it is possible to omit the kick operation for the bit line BL that can be determined to be in an on state in advance. As a result, in the semiconductor memory 1 according to the second embodiment, it is possible to obtain the same effects as those of the first embodiment.

In the semiconductor memory 1 according to the second embodiment, the roles of the two transistors 54 and 58 in the first embodiment are achieved by one transistor 82.

As a result, in the semiconductor memory 1 according to the second embodiment, the number of elements in the sense amplifier unit SAU can be made smaller than that in the first embodiment. Therefore, in the semiconductor memory 1 according to the second embodiment, the circuit area of the sense amplifier unit SAU can be reduced as compared with the first embodiment, and the chip area of the semiconductor memory 1 can be kept small.

The semiconductor memory 1 according to the second embodiment omits the kick operation in the first read process for all the bit lines BL. Thus, similarly to the first embodiment, in the semiconductor memory 1 according to the second embodiment, it is possible to reduce the number of error bits and improve the reliability of data.

Further, in the semiconductor memory 1 according to the second embodiment, similar to the first embodiment, in the second and subsequent read processes, the sequencer 13 may execute a kick operation for the bit line BL corresponding to the memory cell transistor MT of which being turned on is not clear, according to the read voltage to be applied.

[2-4] Modification Example of Second Embodiment

In the semiconductor memory 1 according to the second embodiment described above, the read operation in which read voltages are applied in order from the lowest read voltage is given as an example, but the present disclosure is not limited thereto. For example, similarly to the modification example of the first embodiment, the operation described in the second embodiment can be applied, even in the case where the read voltage is applied from the highest read voltage.

Hereinafter, an example of a read operation in the modification example of the second embodiment will be described.

Figure 17:
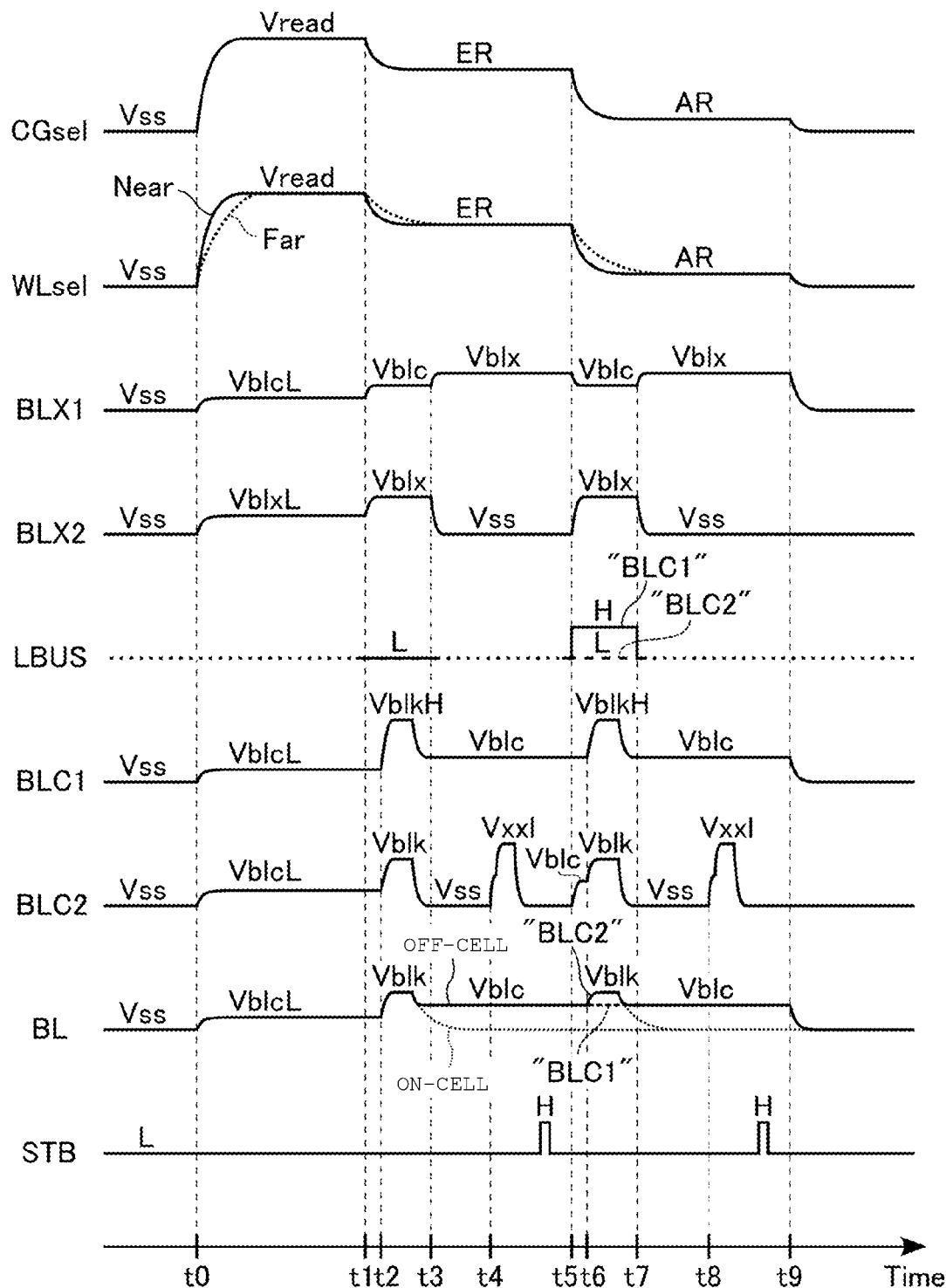
FIG. 17 is a timing chart illustrating an example of a read operation in a modification example of the second embodiment.

FIG. 17 illustrates an example of a timing chart in the read operation of the lower page data in the modification example of the second embodiment.

As illustrated in FIG. 17, in the read operation in the modification example of the first embodiment, the order in which the read voltage is applied is switched for the read operation in the first embodiment described with reference to FIG. 16.

That is, in the read operation of the modification example of the second embodiment, at time t1, the read voltage ER is applied to the selected signal line CGsel. At time t5, the read voltage AR is applied to the selected signal line CGsel. Then, the voltage of the selected word line WLsel falls, based on the voltage of the selected signal line CGsel, similarly to the modification example of the first embodiment.

In the read operation in the modification example of the second embodiment, similar to the modification example of the first embodiment, in the first kick operation, the kick operation for all the bit lines BL is executed.

Specifically, at time t1, the sequencer 13 sets the voltage of the bus LBUS to "L" level. When the voltage of the bus LBUS is "L" level, the transistor 83 is turned on. That is, each of a voltage due to a path passing through the transistors 50, 80, and 81 and a voltage due to a path passing through the transistors 83, 84, 82, and 81 is applied to the bit line BL. Therefore, at time t2, a voltage based on the kick voltage Vblk is applied to the bit line BL, corresponding to the control signal BLC2, for example.

Since the other operations of the read operation in the modification example of the second embodiment are similar to the read operation in the second embodiment, a description thereof will be omitted. While the read operation of the lower page data is shown as the modification example of the second embodiment, the same operation may be executed for the read operation of each of the middle page data and the upper page data.

According to the semiconductor memory 1 in the modification example of the second embodiment described above, in the read operation, similarly to the modification example of the first embodiment, it is possible to execute the kick operation for the bit line BL that can be determined to be in an off state in advance. As a result, in the read operation in the modification example of the second embodiment, it is possible to obtain the same effect as in the modification example of the first embodiment.

In the read operation in the modification example of the second embodiment, similar to the modification example of the first embodiment, the kick operation in the first read process is executed for all the bit lines BL. Thus, in the read operation in the modification example of the second embodiment, similar to the modification example of the first embodiment, it is possible to reduce the number of error bits and improve the reliability of data.

Further, in the read operation in the modification example of the second embodiment, similar to the modification example of the first embodiment, in the second and subsequent read processes, a kick operation may be omitted for the bit line BL corresponding to the memory cell transistor MT of which being turned on is not clear, according to the read voltage to be applied.

[3] Third Embodiment

The semiconductor memory 1 according to the third embodiment has a circuit configuration of the sense amplifier module 16 different from in the first and second embodiments. In the semiconductor memory 1 according to the third embodiment, in the read operation, whether or not a kick operation is to be executed is set for each read voltage. With respect to a semiconductor memory 1 according to the third embodiment, different features from those of the first and second embodiments will be described below.

[3-1] Circuit Configuration of Sense Amplifier Module 16

Figure 18:
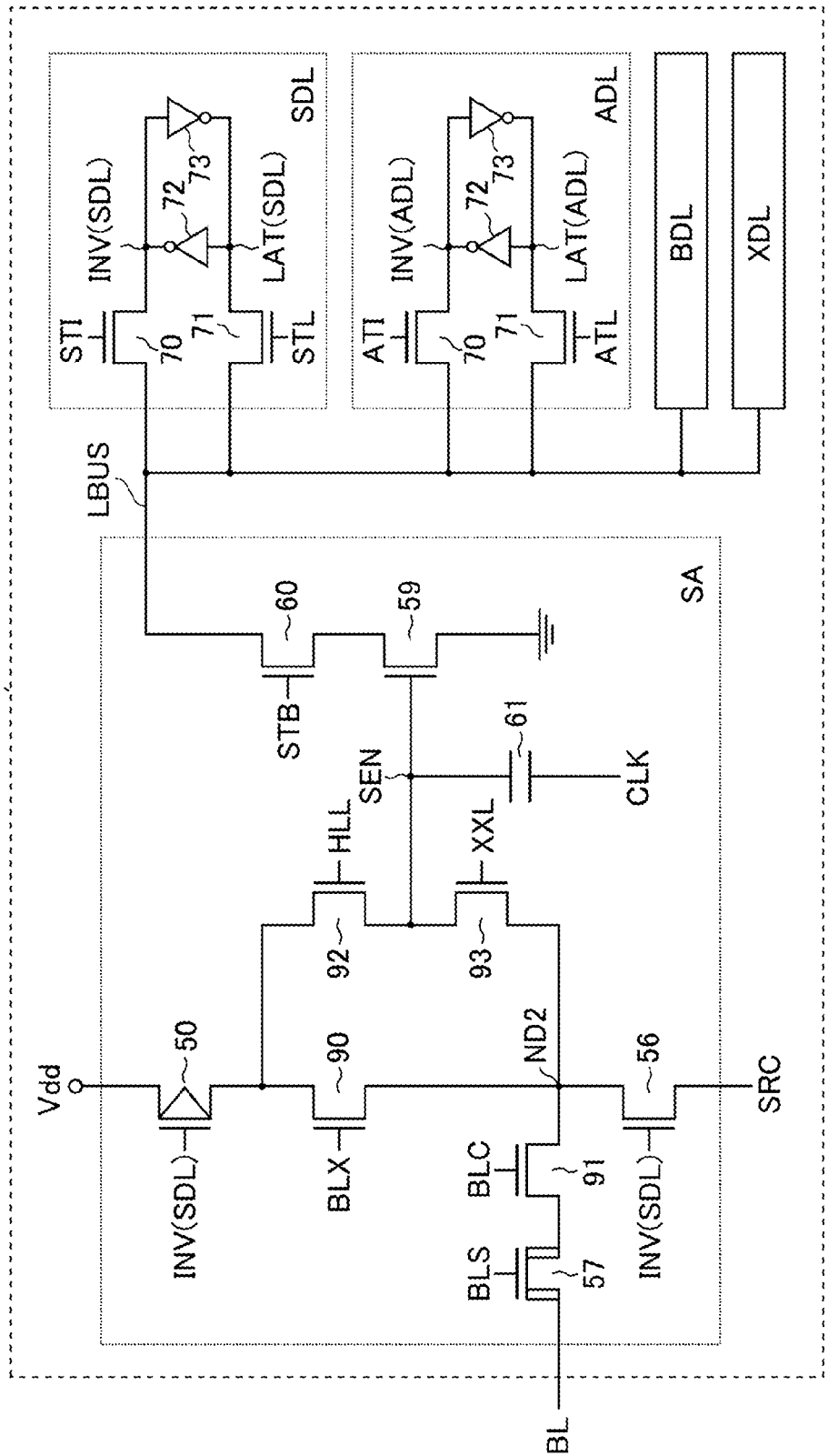
FIG. 18 is a circuit diagram illustrating an example of a circuit configuration of a sense amplifier module in a semiconductor memory according to a third embodiment.

FIG. 18 illustrates an example of the circuit configuration of the sense amplifier module 16 in the semiconductor memory according to the third embodiment, by extracting one sense amplifier unit SAU out of a plurality of sense amplifier units SAU in the sense amplifier module 16.

As illustrated in FIG. 18, a sense amplifier unit SA in the third embodiment has a configuration in which transistors 51 to 55, and 58 are omitted from the sense amplifier unit SA described with reference to FIG. 11 in the first embodiment and transistors 90 to 93 are added thereto.

Each of the transistors 90 to 93 is, for example, an n-channel MOS transistor.

One end of the transistor 90 is connected to the other end of the transistor 50. The other end of the transistor 90 is connected to the node ND2. A control signal BLX is input to the gate of the transistor 90.

The transistor 91 is connected to one end of the transistor 57 and the node ND2. Specifically, one end of the transistor 91 is connected to the node ND2, and the other end of the transistor 91 is connected to one end of the transistor 57. A control signal BLC is input to the gate of the transistor 91.

One end of the transistor 92 is connected to the other end of the transistor 50. The other end of the transistor 92 is connected to the node SEN.

A control signal HLL is input to the gate of the transistor 92.

One end of the transistor 93 is connected to the node SEN. The other end of the transistor 93 is connected to the node ND2. A control signal XXL is input to the gate of the transistor 93.

Since the other configurations of the semiconductor memory 1 according to the third embodiment are similar to, for example, the semiconductor memory 1 according to the first embodiment, the explanation is omitted.

[3-2] Read Operation of Semiconductor Memory 1

Read Operation in Comparative Example of Third Embodiment

Before explaining the read operation of the semiconductor memory 1 according to the third embodiment, the read operation in the comparative example of the third embodiment is explained. In the read operation in the comparative example of the third embodiment, in the read process corresponding to the all the read voltages, the kick operation for the control signal BLC is executed.

Figure 19:
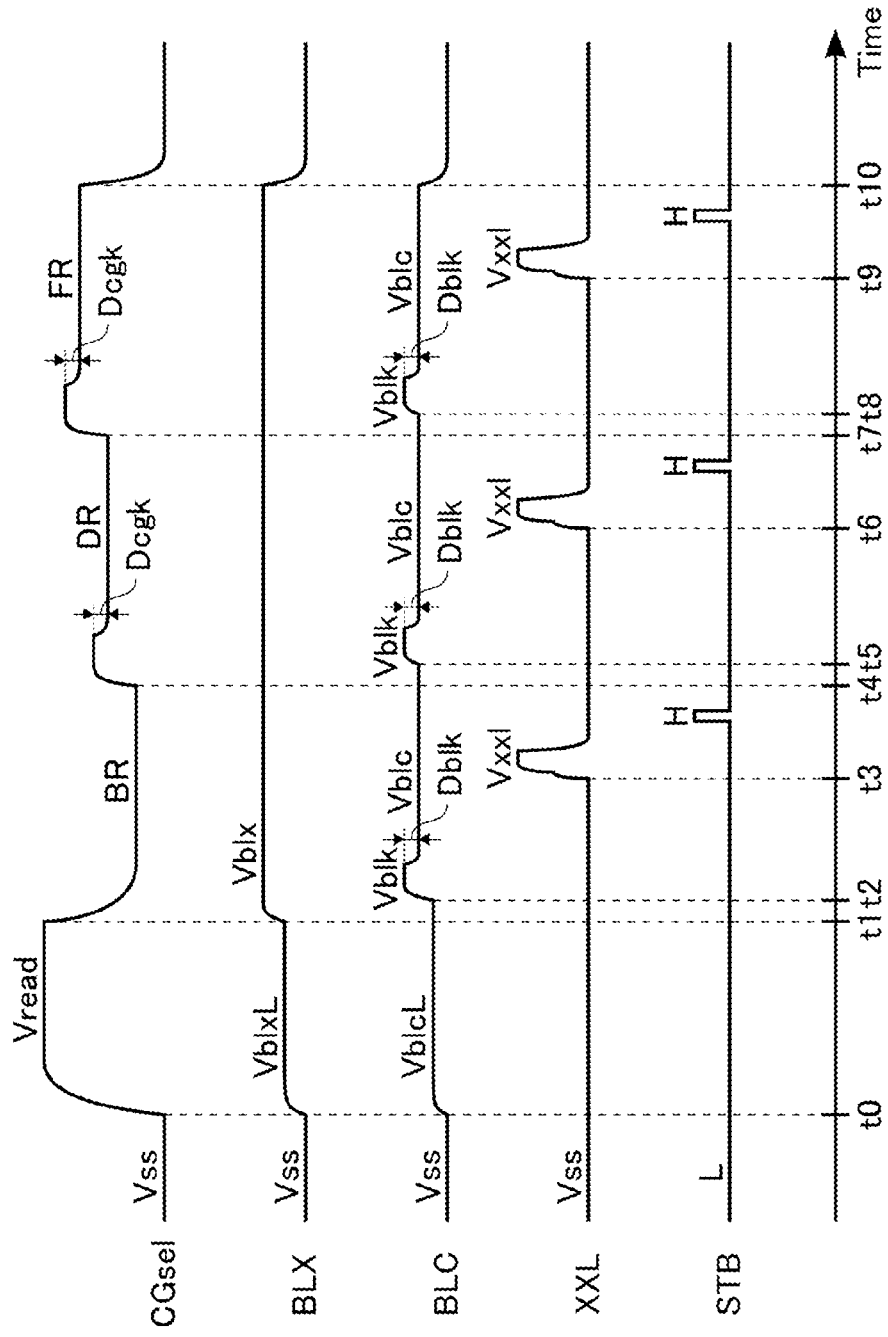
FIG. 19 is a timing chart illustrating an example of a read operation in a comparative example.

FIG. 19 illustrates an example of a timing chart in the read operation of the middle page data in the comparative example of the third embodiment. In the read operation in the comparative example of the third embodiment, it is defined that the transistor 50 is in an on state similarly to the first embodiment and supplies a voltage to the transistors 90 and 92.

In a comparative example of the third embodiment, it is assumed that the control signal HLL is properly controlled by the sequencer 13 and the transistor 92 properly charges the node SEN. It is assumed that the voltages of the selected word line WLsel and the bit line BL change according to the voltages of the selected signal line CGsel and the control signal BLC, respectively, similarly to the first embodiment.

As illustrated in FIG. 19, at the start of the read operation, the respective voltages of the selected signal line CGsel, the selected word line WLsel, the control signal BLX, BLC, and XXL are, for example, a ground voltage Vss. The voltage of the control signal STB is, for example, "L" level.

When the read operation of the middle page data is started, the sequencer 13 executes an operation of removing residual electrons in the channel, for example, in the period from the time t0 to the time t1, similarly to the first embodiment. In the period from the time t1 to the time t4, the sequencer 13 executes a read process using the read voltage BR. In the period from the time t4 to the time t7, the sequencer 13 executes a read process using the read voltage DR. In the period from the time t7 to the time t10, the sequencer 13 executes a read process using the read voltage FR.

Specifically, at time t0, for example, the read pass voltage Vread is applied to the selected signal line CGsel. Then, the voltage of the selected word line WLsel rises based on the voltage applied to the selected signal line CGsel.

Further, at time t0, for example, the sequencer 13 raises the voltage of the control signal BLX from Vss to VblxL, and raises the voltage of the control signal BLC from Vss to VblcL. At this time, the voltage clamped by the transistors 90 and 91, for example, is applied to the bit line BL.

Next, at time t1, the read voltage BR is applied to the selected signal line CGsel. Then, the voltage of the selected word line WLsel falls based on the voltage applied to the selected signal line CGsel. Further, at time t1, the sequencer 13 raises the voltage of the control signal BLX from VblxL to Vblc, for example.

Next, at time t2, the sequencer 13 executes the kick operation for the control signal BLC. Specifically, the kick voltage Vblk is first applied to the signal line to which the control signal BLC is supplied, and Vblc is applied after the kick voltage Vblk is applied for a short time.

Further, while the read voltage BR is applied to the selected word line WLsel, the voltage of the bit line BL changes according to the state of the selected memory cell, as in the first embodiment.

Next, at time t3, the sequencer 13 raises the voltage of the control signal XXL from. Vss to Vxxl. When the voltage of the control signal XXL rises to Vxxl, the transistor 93 is turned on. Then, the voltage of the node SEN changes according to the voltage of the bit line BL, that is, the state of the selected memory cell.

Then, after the voltage of the bit line BL is reflected on the node SEN, the sequencer 13 lowers the voltage of the control signal XXL from Vxxl to Vss. When the voltage of the control signal XXL falls to Vss, the transistor 93 is turned off and the voltage of the node SEN is fixed.

Thereafter, the sequencer 13 asserts the control signal STB and determines the data to be stored in the selected memory cell. Specifically, the sense amplifier unit SAU determines whether or not the threshold voltage of the corresponding selected memory cell is equal to or higher than the read voltage BR, and stores the determination result in the latch circuit ADL, for example.

Next, at time t4, the read voltage DR is applied to the selected signal line CGsel. At this time, similarly to the first embodiment, the sequencer 13 executes the kick operation for the selected signal line CGsel. Then, similarly to the first embodiment, the voltage of the selected word line WLsel rises, based on the voltage applied to the selected signal line CGsel.

Next, at time t5, the sequencer 13 executes the kick operation for the control signal BLC. Since the operation of the semiconductor memory 1 at the time t5 is similar to the operation at the time t2, the explanation is omitted. While the read voltage DR is applied to the selected word line WLsel, the voltage of the bit line BL changes according to the state of the selected memory cell.

Next, at time t3, the sequencer 13 controls the control signal XXL similarly to the time t3, and reflects the voltage of the bit line BL on the voltage of the node SEN. Thereafter, the sequencer 13 asserts the control signal STB and determines the data to be stored in the selected memory cell.

Specifically, the sense amplifier unit SAU determines whether or not the threshold voltage of the corresponding selected memory cell is equal to or higher than the read voltage ER. The sequencer 13 performs the calculation based on the above determination result and the determination result of the read voltage BR stored in the latch circuit ADL, and stores an operation result, for example, in the latch circuit BDL.

Next, at time t7, the read voltage FR is applied to the selected signal line CGsel. At this time, similarly to the first embodiment, the sequencer 13 executes the kick operation for the selected signal line CGsel. Then, similarly to the first embodiment, the voltage of the selected word line WLsel rises, based on the voltage applied to the selected signal line CGsel.

Next, at time t8, the sequencer 13 executes the kick operation for the control signal BLC. Since the operation of the semiconductor memory 1 at the time t8 is similar to the operation at the time t2, the explanation is omitted. While the read voltage FR is applied to the selected word line WLsel, the voltage of the bit line BL changes according to the state of the selected memory cell.

Next, at time t9, the sequencer 13 controls the control signal XXL similarly to the time t3, and reflects the voltage of the bit line BL on the voltage of the node SEN. Thereafter, the sequencer 13 asserts the control signal STB and determines the data to be stored in the selected memory cell.

Specifically, the sense amplifier unit SAU determines whether or not the threshold voltage of the corresponding selected memory cell is equal to or higher than the read voltage FR. Then, the sequencer 13 determines the middle page data based on the determination result and the determination result based on the read voltages BR and DR stored in the latch circuit BDL, and supplies the determined middle page data to, for example, the latch circuit XDL.

Next, at time t10, the sequencer 13 returns each of the selected signal line CGsel, and the control signals BLX, BLC, and XXL to the state before the read operation, and finishes the read operation of the middle page data. When the memory controller 2 detects that the semiconductor memory 1 completes the read operation of the middle page data, the memory controller 2 causes the semiconductor memory 1 to output the lower page data.

Read Operation in Third Embodiment

For the read operation in the comparative example of the third embodiment described above, in the read operation in the third embodiment, whether or not to execute the kick operation for the control signal BLC is set for each read voltage.

FIG. 20 illustrates an example of the condition of the kick operation in the read operation of a semiconductor memory according to the third embodiment.

As illustrated in FIG. 20, the sequencer 13 omits the kick operation for the control signal BLC, in each of read processes corresponding to the read voltages AR, BR, and CR, for example. Further, the sequencer 13 executes the kick operation for the control signal BLC, in each of read processes corresponding to the read voltages DR, ER, FR, and GR, for example.

In other words, the semiconductor memory 1 according to the third embodiment is divided into, for example, two groups of a group having a low read voltage (for example, the read voltages AR, BR, and CR) and a group having a high read voltage (for example, the read voltages DR, ER, FR, and GR). Then, the sequencer 13 omits a kick operation for the control signal BLC in a group having a low read voltage and executes the kick operation in a group having a high read voltage.

Incidentally, in the read operation, the setting of whether or not to execute the kick operation for the control signal BLC is not limited to the grouping described above, and may be changed to any setting.

Figure 21:
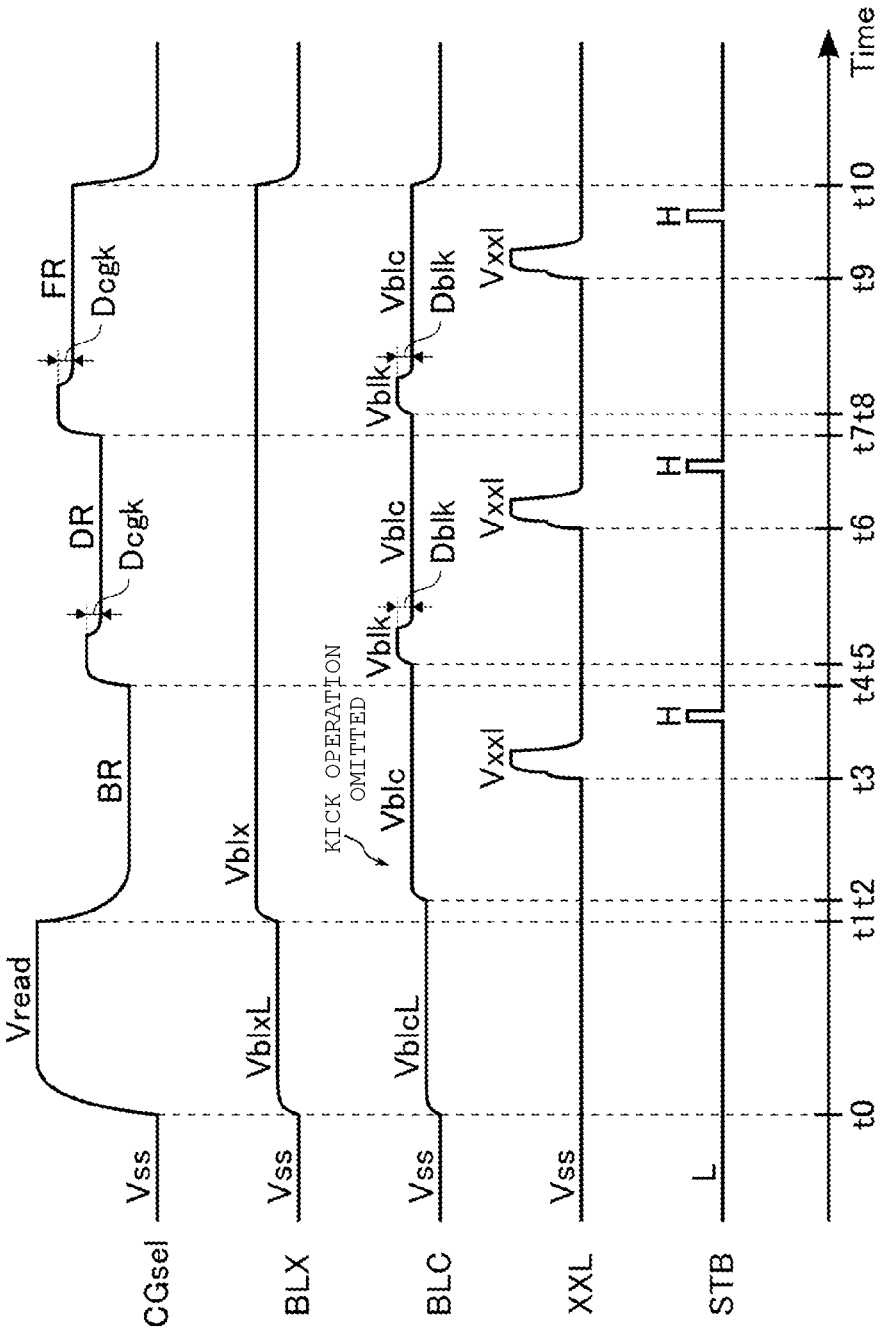
FIG. 21 is a timing chart illustrating an example of the read operation of the semiconductor memory according to the third embodiment.

FIG. 21 illustrates an example of a timing chart in the read operation of the middle page data in the semiconductor memory 1 according to the third embodiment.

As illustrated in FIG. 21, in the read operation in the third embodiment, the kick operation corresponding to the read voltage BR is omitted from the read operation in the comparative example in the third embodiment described with reference to FIG. 19.

Specifically, at time t2, the sequencer 13 does not raise the voltage of the control signal BLC to the kick voltage Vblk and raises to Vblc. Therefore, at time t2, a voltage based on Vblc is applied to the bit line BL, corresponding to the control signal BLC, for example. Since the other operations of the read operation in the third embodiment are similar to the read operation in the comparative example of the third embodiment, a description thereof will be omitted.

As described above, the semiconductor memory 1 according to the third embodiment can execute the read operation of the middle page data. Incidentally, in the semiconductor memory 1 according to the third embodiment, in the read operation of each of the lower page data and the upper page data, similarly to the read operation of the middle page data, the kick operation can be appropriately executed for each read voltage.

[3-3] Effect of Third Embodiment

For example, it is considered that the number of memory cell transistors MT to be turned on by a low read voltage is smaller than the number of memory cell transistors MT to be turned on by a high read voltage.

In other words, it is considered that the number of memory cell transistors MT to be turned off by a low read voltage is larger than the number of memory cell transistors MT to be turned off by a high read voltage.

As described above, in the read operation, whether the number of on-cells is dominant or the number of off-cells is dominant may be assumed from the value of the read voltage. That is, the number of off-cells affected by noise by the bit line BL connected to the on-cell may be assumed, based on the relationship between the number of on-cells and the number of off-cells.

Therefore, in the semiconductor memory 1 according to the third embodiment, whether or not to execute the kick operation for the bit line BL is set for each read voltage. Specifically, the sequencer 13 omits the kick operation in the group having a low read voltage (for example, the read voltages AR, BR, and CR), and executes the kick operation in the group having a high read voltage (for example, the read voltages DR, ER, FR, and GR).

That is, the sequencer 13 omits the kick operation, in the read process of a group which is estimated that the number of off-cells is dominant and the number of memory cells capable of causing erroneous reading caused by the kick operation is large. On the other hand, the sequencer 13 executes the kick operation, in the read process of a group which is estimated that the number of on-cells is dominant and the number of memory cells capable of causing erroneous reading caused by the kick operation is small.

As described above, in the semiconductor memory 1 according to the third embodiment, an appropriate read process can be executed in each of a group having a high read voltage and a group having a low read voltage. As a result, similarly to the first embodiment, in the semiconductor memory 1 according to the third embodiment, it is possible to reduce the number of error bits and improve the reliability of data.

[3-4] Modification Example of Third Embodiment

In the semiconductor memory 1 according to the third embodiment described above, the read operation in which read voltages are applied in order from the lowest read voltage is given as an example, but the present disclosure is not limited thereto. For example, similarly to the modification example of the first embodiment, the operation described in the third embodiment can be applied, even in the case where the read voltage is applied from the highest read voltage.

Hereinafter, an example of a read operation in the modification example of the third embodiment will be described.

Figure 22:
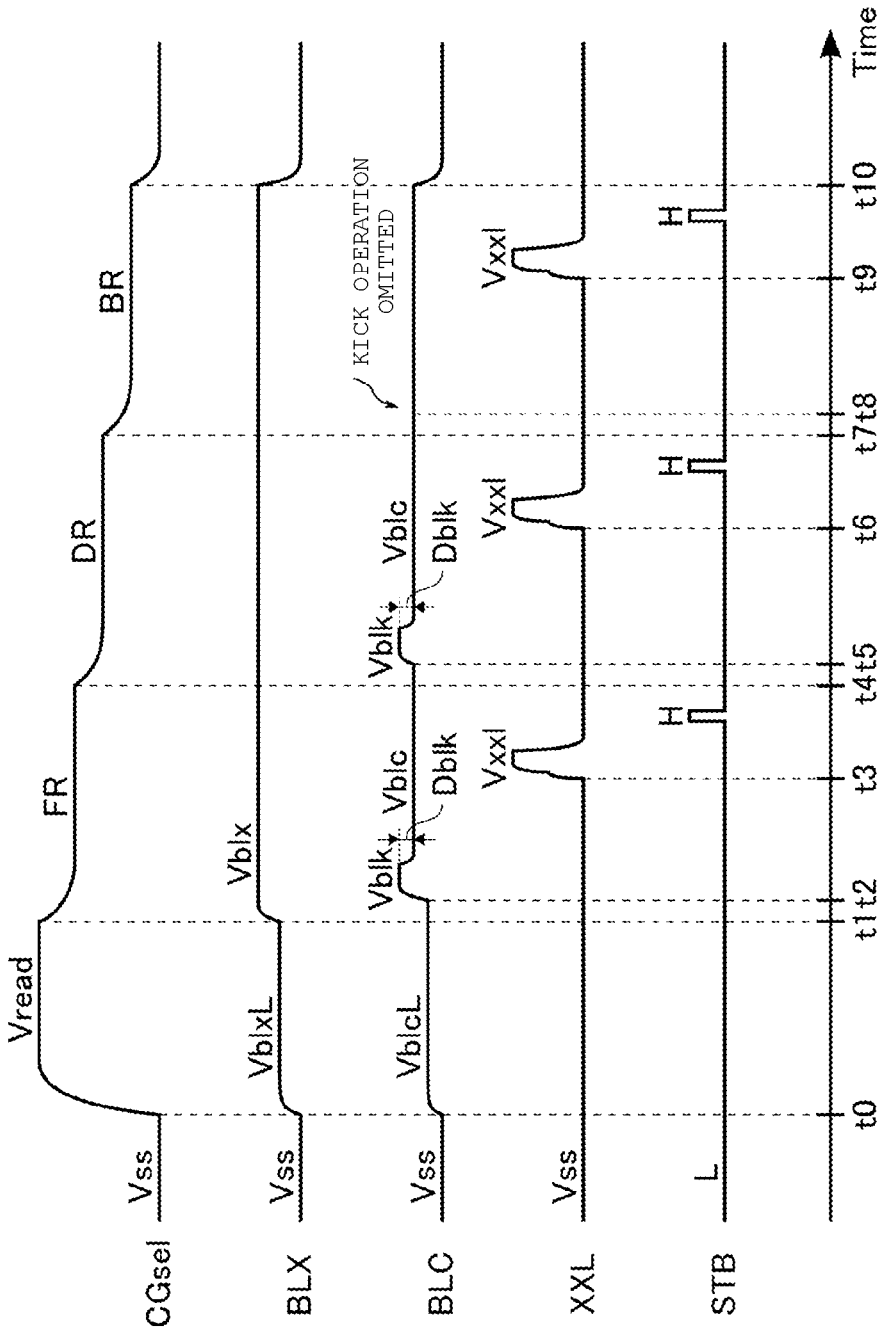
FIG. 22 is a timing chart illustrating an example of a read operation in a modification example of the third embodiment.

FIG. 22 illustrates an example of a timing chart in the read operation of the middle page data in the modification example of the third embodiment.

As illustrated in FIG. 22, in the read operation in the modification example of the third embodiment, the order in which the read voltage is applied is switched for the read operation in the third embodiment described with reference to FIG. 21.

That is, in the read operation of the modification example of the third embodiment, at time t1, the read voltage FR is applied to the selected signal line CGsel. At time t4, the read voltage DR is applied to the selected signal line CGsel. At time t7, the read voltage BR is applied to the selected signal line CGsel. Then, the voltage of the selected word line WLsel falls, based on the voltage of the selected signal line CGsel, similarly to the modification example of the first embodiment.

Further, in the modification example of the third embodiment, similar to the read operation in the third embodiment, the sequencer 13 executes the read operation, based on the setting of the kick operation for the control signal BLC shown in FIG. 20.

Specifically, for example, in the read operation of the middle page, the sequencer 13 executes a kick operation in the read process using each of the read voltages FR and DR, and omits a kick operation in the read process using the read voltage BR.

Since the other operations of the read operation in the modification example of the third embodiment are similar to the read operation in the third embodiment, a description thereof will be omitted. While the read operation of the middle page data is shown as the modification example of the third embodiment, the same operation may be executed for the read operation of each of the lower page data and the upper page data.

As described above, in the read operation in the modification example of the third embodiment, similar to the third embodiment, an appropriate read process may be executed in each of a group having a high read voltage and a group having a low read voltage. As a result, in the read operation in the modification example of the third embodiment, it is possible to obtain the same effect as in the third embodiment.

[4] Fourth Embodiment

A semiconductor memory 1 according to a fourth embodiment has the same configuration as that of the third embodiment. In the semiconductor memory 1 according to the fourth embodiment, a kick amount is changed for each read voltage. With respect to a semiconductor memory 1 according to a fourth embodiment, different features from those of the first to third embodiments will be described below.

[4-1] Read Operation of Semiconductor Memory 1

FIG. 23 illustrates an example of the condition of the kick operation in the read operation of a semiconductor memory according to the fourth embodiment.

As illustrated in FIG. 23, for example, similar to the third embodiment, the sequencer 13 omits a kick operation for the control signal BLC, in each of the read processes corresponding to the read voltages AR, BR, and CR, and executes a kick operation for the control signal BLC, in each of the read processes corresponding to the read voltages DR, ER, FR, and GR.

In the fourth embodiment, in the kick operation for the control signal BLC, for example, the sequencer 13 applies a small kick amount corresponding to each of the read voltages DR and ER, and applies a large kick amount corresponding to each of the read voltages FR and GR.

Incidentally, in the read operation, each of the setting of whether or not to execute the kick operation for the control signal BLC and the setting of the kick amount may be changed to any setting. The setting of the kick amount is not limited to two types of "large" or "small", and three or more settings may be used.

Figure 24:
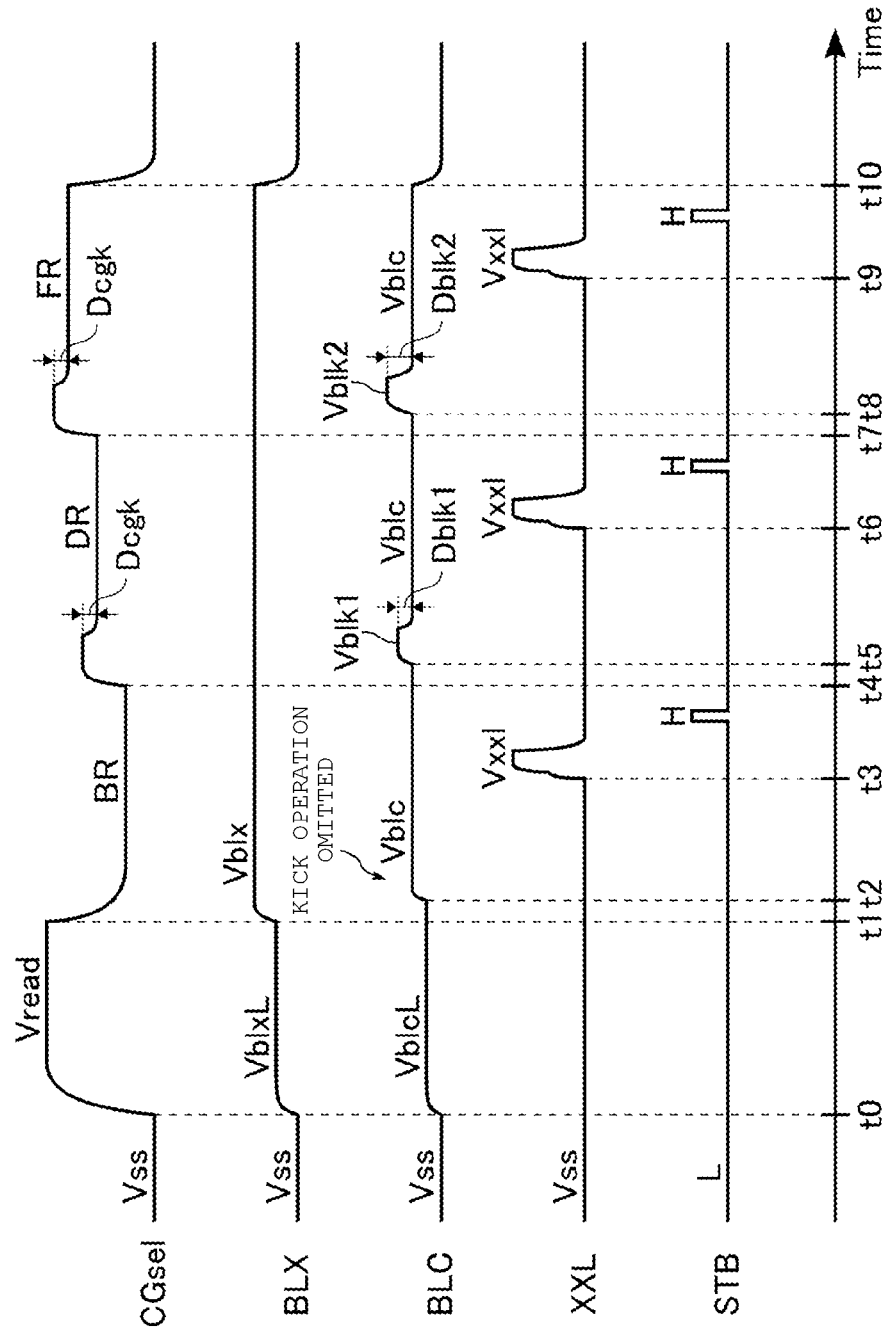
FIG. 24 is a timing chart illustrating an example of the read operation of the semiconductor memory according to the fourth embodiment.

FIG. 24 illustrates an example of a timing chart in the read operation of the middle page data in the semiconductor memory 1 according to the fourth embodiment.

As illustrated in FIG. 24, in the read operation in the fourth embodiment, similar to the read operation in the third embodiment described with reference to FIG. 21, the kick operation in the read process using the read voltage FR at time t2 is omitted.

Then, the read operation in the fourth embodiment is different from the read operation in the third embodiment in the kick voltages in the read process using the read voltage DR and the read process using the read voltage FR.

Specifically, at time t5, the sequencer 13 executes a kick operation corresponding to the read voltage DR. At this time, the kick voltage Vblk1 is first applied to the signal line to which the control signal BLC is supplied, and Vblc is applied after the kick voltage Vblk1 is applied for a short time. The kick voltage Vblk1 is higher than Vblc, and the difference between Vblk1 and Vblc corresponds to the kick amount Dblk1.

At time t8, the sequencer 13 executes a kick operation corresponding to the read voltage FR. At this time, the kick voltage Vblk2 is first applied to the signal line to which the control signal BLC is supplied, and Vblc is applied after the kick voltage Vblk2 is applied for a short time. The kick voltage Vblk2 is higher than Vblk1, and a difference between Vblk2 and Vblc corresponds to the kick amount Dblk2.

As illustrated above, in the fourth embodiment, the kick amount Dblk2 of the kick voltage Vblk2 is set larger than the kick amount Dblk1 of the kick voltage Vblk1. Therefore, the voltage applied to the bit line BL by the kick operation at the time t8 is higher than the voltage applied to the bit line BL by the kick operation at the time t5. Since the other operations of the read operation in the fourth embodiment are similar to the read operation in the third embodiment, a description thereof will be omitted.

As described above, the semiconductor memory 1 according to the fourth embodiment can execute the read operation of the middle page data. Incidentally, in the semiconductor memory 1 according to the fourth embodiment, in the read operation of each of the lower page data and the upper page data, similarly to the read operation of the middle page data, the kick operation can be appropriately executed for each read voltage, and the kick operation can be appropriately changed for each read voltage.

[4-2] Effect of Fourth Embodiment

It may be assumed that an appropriate kick amount in the read operation is different depending on the read voltage of the read process in which the kick operation is executed.

For example, since the memory cell with a high threshold voltage is unlikely to be turned on, it may be assumed that it is preferable to apply a high kick amount when a kick operation is applied. On the other hand, since the memory cell with a low threshold voltage tends to be relatively easily turned on, it may be assumed that it is preferable to apply a low kick amount when a kick operation is applied.

Therefore, in the semiconductor memory 1 according to the fourth embodiment, whether or not to execute the kick operation for the bit line BL is set for each read voltage, as in the third embodiment. In the fourth embodiment, in a case where the kick operation for the bit line BL is executed, the kick amount is changed based on the corresponding read voltage.

Thus, in the semiconductor memory 1 according to the fourth embodiment, an appropriate kick amount may be applied for each read process. That is, in the semiconductor memory 1 according to the fourth embodiment, it is possible to prevent an increase in the number of error bits caused by performing a kick operation for the bit line BL connected to the on-cell. As a result, in the semiconductor memory 1 according to the fourth embodiment, it is possible to reduce the number of error bits as compared to the third embodiment, and improve the reliability of data.

[4-3] Modification Example of Fourth Embodiment

In the semiconductor memory 1 according to the fourth embodiment described above, the read operation in which read voltages are applied in order from the lowest read voltage is given as an example, but the present disclosure is not limited thereto. For example, similarly to the modification example of the first embodiment, the operation described in the fourth embodiment may be applied, even in the case where the read voltage is applied from the highest read voltage.

Hereinafter, an example of a read operation in the modification example of the fourth embodiment will be described.

Figure 25:
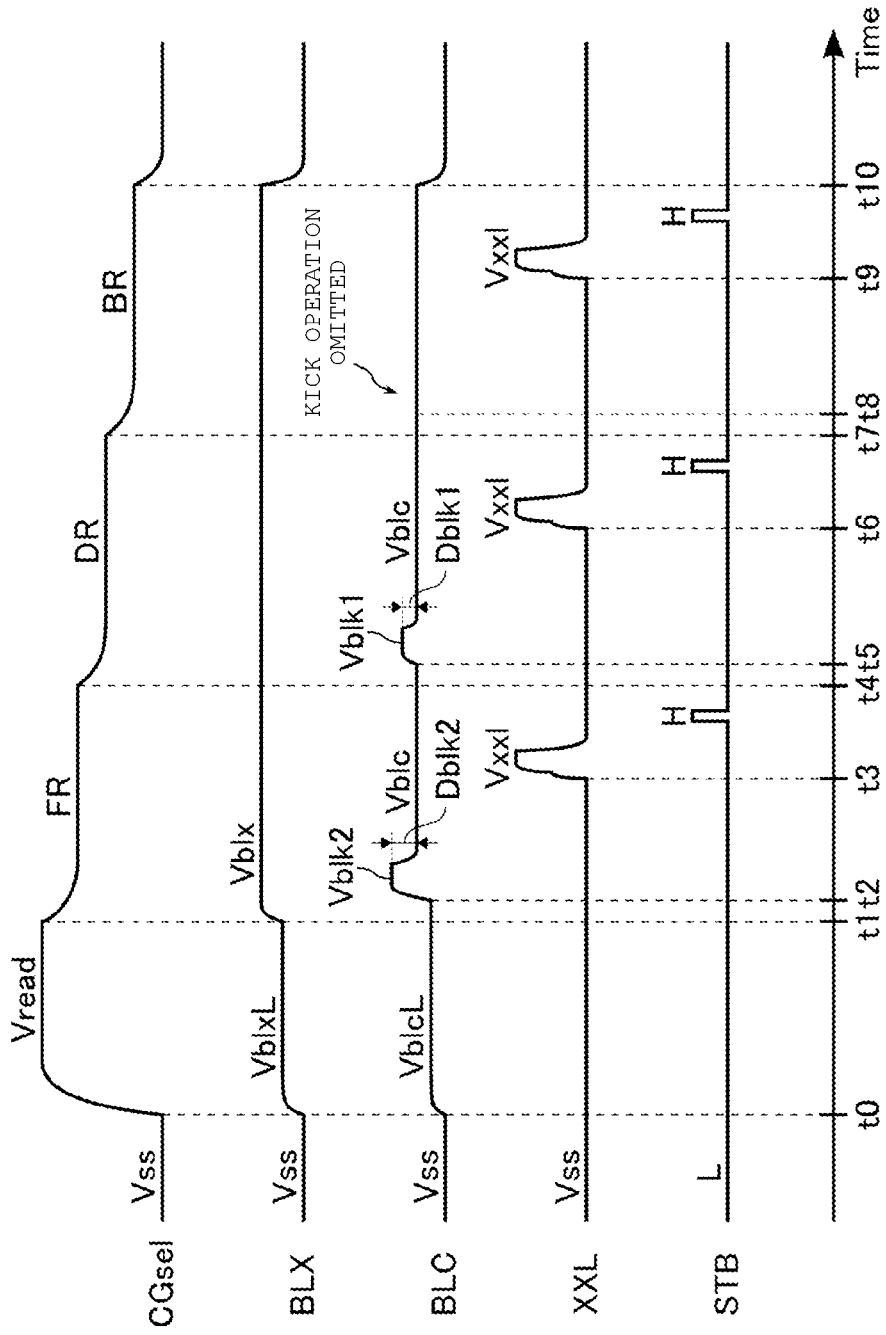
FIG. 25 is a timing chart illustrating an example of a read operation in a modification example of the fourth embodiment.

FIG. 25 illustrates an example of a timing chart in the read operation of the middle page data in the modification example of the fourth embodiment.

As illustrated in FIG. 25, in the read operation in the modification example of the fourth embodiment, the order in which the read voltage is applied is switched for the read operation in the fourth embodiment described with reference to FIG. 24.

That is, in the read operation of the modification example of the fourth embodiment, at time t1, the read voltage FR is applied to the selected signal line CGsel. At time t4, the read voltage DR is applied to the selected signal line CGsel. At time t7, the read voltage BR is applied to the selected signal line CGsel. Then, the voltage of the selected word line WLsel falls, based on the voltage of the selected signal line CGsel, similarly to the modification example of the first embodiment.

Further, in the modification example of the fourth embodiment, similar to the read operation in the fourth embodiment, the sequencer 13 executes the read operation, based on the setting of the kick operation for the control signal BLC shown in FIG. 23.

Specifically, for example, in the read operation of the middle page, the sequencer 13 executes the kick operation to which the kick amount Dblk2 is applied, in the read process using the read voltage FR. In the read process using the read voltage DR, the sequencer 13 executes the kick operation to which the kick amount Dblk1 is applied. In the read process using the read voltage BR, the sequencer 13 omits the kick operation.

Since the other operations of the read operation in the modification example of the fourth embodiment are similar to the read operation in the fourth embodiment, a description thereof will be omitted. While the read operation of the middle page data is shown as the modification example of the fourth embodiment, the same operation may be executed for the read operation of each of the lower page data and the upper page data.

As described above, in the read operation in the modification example of the fourth embodiment, similar to the fourth embodiment, an appropriate read process can be executed in each of a group having a high read voltage and a group having a low read voltage. As a result, in the read operation in the modification example of the fourth embodiment, it is possible to obtain the same effect as in the fourth embodiment.

[5] Other Modification Examples

The semiconductor memory of embodiments includes first and second memory cells, word lines, first and second bit lines, first and second sense amplifiers, and a controller. Each of the first and second memory cells stores a plurality of bits of data based on a threshold voltage. The word lines are connected to the respective gates of the first and second memory cells. The first and second bit lines are connected to the first and second memory cells, respectively. The first and second sense amplifiers are connected to the first and second bit lines, respectively. Each of the first and second sense amplifiers includes a first transistor, a second transistor, and a third transistor. One end of the third transistor is electrically connected to each of the first transistor and the second transistor, and the other end is connected to the corresponding bit line. In the read operation of the first and second memory cells, the controller applies a first read voltage to the word line at a first time <for example, in FIG. 13, t5> in a first period when the controller applies the first read voltage, the controller applies a first voltage <for example, in FIG. 13, Vblk> higher than a ground voltage to the first transistor, and applies a second voltage <for example, in FIG. 13, Vblc> different from the first voltage to the second transistor. At the first time, the first sense amplifier applies a voltage to the first bit line via the first transistor and the third transistor, the second sense amplifier applies a voltage to the second bit line via the second transistor and the third transistor. Thus, in the semiconductor memory according to the embodiment, it is possible to speed up the read operation.

In the first embodiment, the case where the kick amount in the kick operation is uniform is given as an example, but the present disclosure is not limited thereto. For example, in the read operation of the semiconductor memory 1 according to the first embodiment, but as in the fourth embodiment, a different kick amount may be applied for each corresponding read voltage. This read operation is referred to as a first modification example, and will be described below.

Figure 26:
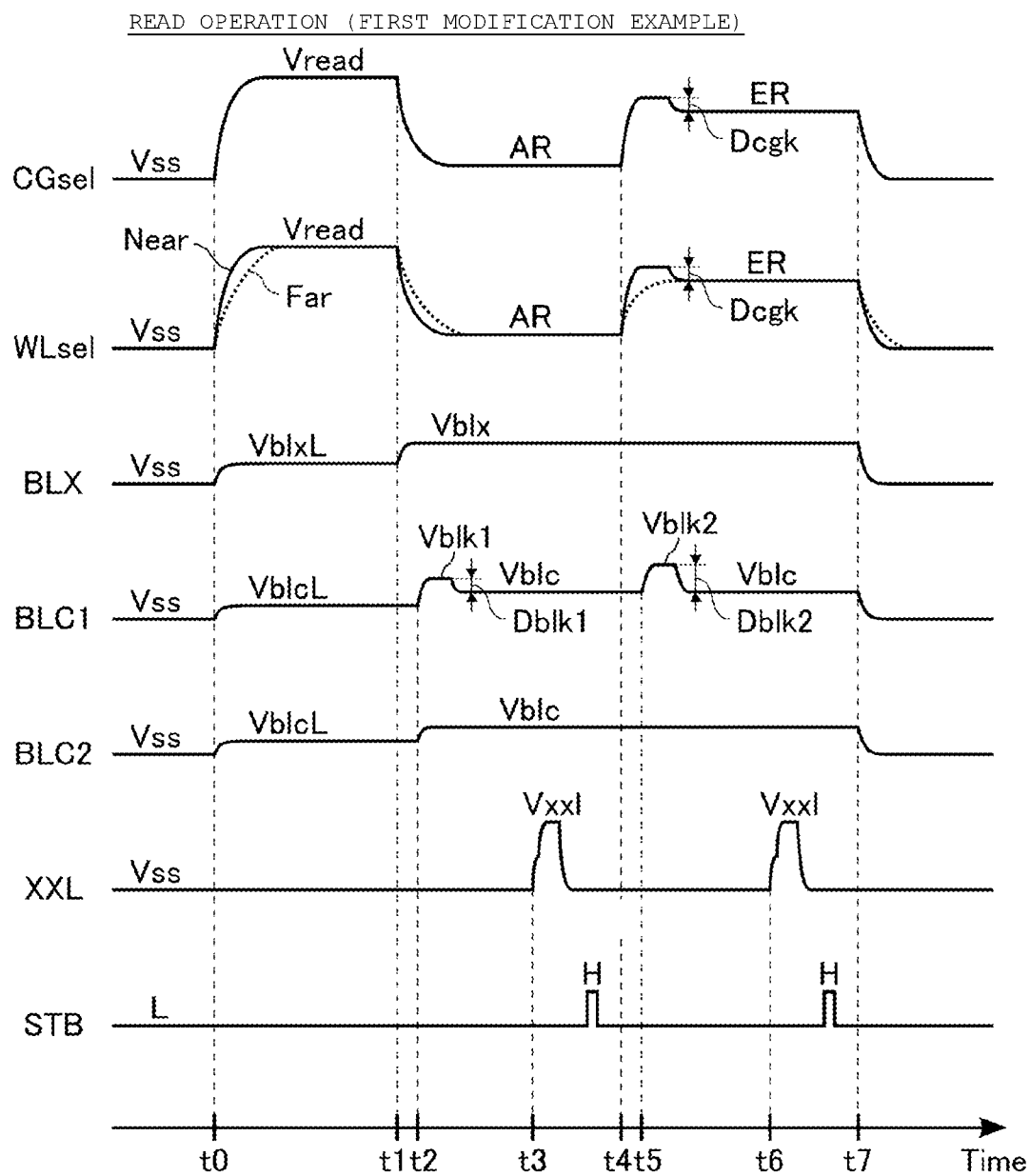
FIG. 26 is a timing chart illustrating an example of a read operation in a first modification example.

FIG. 26 illustrates an example of a timing chart in the read operation of the lower page data in the first modification example. As illustrated in FIG. 26, the read operation in the first modification example is different from the read operation described with reference to FIG. 13 in the first embodiment in that the kick amount of the control signal BLC at time t2 is different from the kick amount of the control signal BLC at time t5.

Specifically, in the read operation in the first modification example, the kick amount Dblk1 is applied in the kick operation at time t2, and the voltage of the control signal BLC1 temporarily rises to Vblk1. In the kick operation at time t5, the kick amount Dblk2 greater than the kick amount Dblk1 is applied, and the voltage of the control signal BLC1 temporarily rises to Vblk2.

Thus, in the read operation in the first modification example, similar to the fourth embodiment, an appropriate kick amount may be applied for each read process. Further, even in a case where the read voltage is applied from the highest read voltage as in the modification example of the first embodiment, similar to the fourth embodiment, an appropriate kick amount may be applied for each read process.

Further, in the second embodiment, the case where the kick amount in the kick motion is uniform is given as an example, but as in the fourth embodiment, a different kick amount may be applied for each corresponding read voltage. This read operation is referred to as a second modification example, and will be described below.

Figure 27:
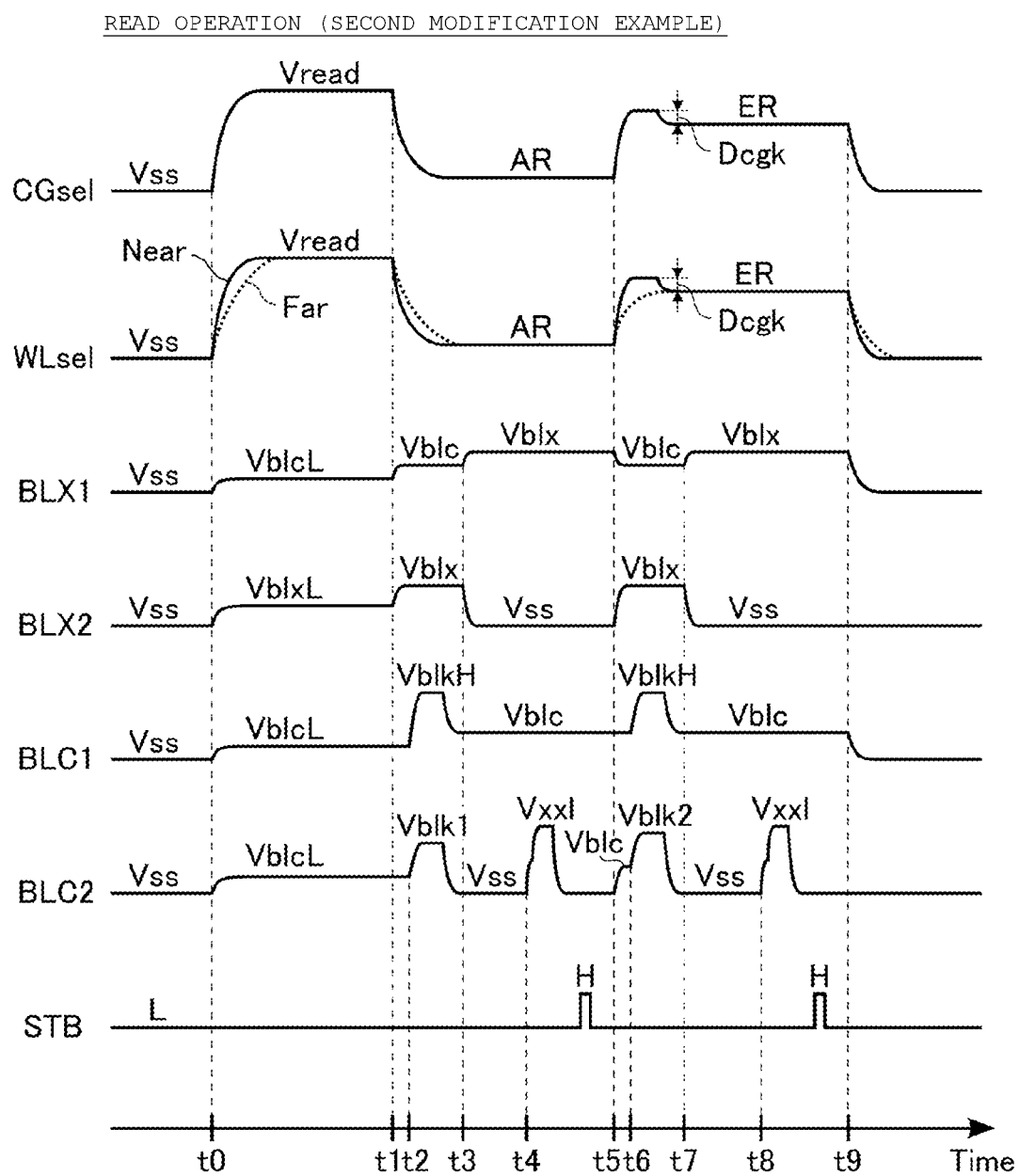
FIG. 27 is a timing chart illustrating an example of a read operation in a second modification example.

FIG. 27 illustrates an example of a timing chart in the read operation of the lower page data in the second modification example. As illustrated in FIG. 27, the read operation in the second modification example is different from the read operation described with reference to FIG. 16 in the second embodiment in that the kick amount of the control signal BLC2 at time t2 is different from the kick amount of the control signal BLC2 at time t6.

Specifically, in the read operation in the second modification example, in the kick operation at time t2, the voltage of the control signal BLC2 temporarily rises to Vblk1. In the kick operation at time t6, the kick amount larger than the kick amount at time t2 is applied, and the voltage of the control signal BLC1 temporarily rises to Vblk2.

Thus, in the read operation in the second modification example, similar to the fourth embodiment, an appropriate kick amount may be applied for each read process. Further, even in a case where the read voltage is applied from the highest read voltage as in the modification example of the second embodiment, similar to the fourth embodiment, an appropriate kick amount may be applied for each read process.

In the above embodiment, the case where the kick amount applied in the kick operation for the selected signal line CGsel is constant is described, but the present disclosure is not limited to this. For example, the kick amount corresponding to the selected signal line CGsel may be changed for each read voltage.

The timing chart used for explaining the read operation in the above embodiments is only an example. For example, the timing at which the voltage of each of the signal and the wiring at each time is controlled may be shifted. In the read operation, at least the front and rear relationships of the operation at each time may not be switched.

In the read operation described in the above embodiments, the case where an operation to remove residual electrons in the channel is inserted before the read process is executed is given as an example, but the present disclosure is not limited to this. In the read operation, the operation of removing residual electrons in the channel may be omitted.

The read operation described in the above embodiments may also be applied to a verify read in a write operation. Even in a case where the above embodiments are applied to the verify read, the semiconductor memory 1 can bring about the same effect as the above embodiment.

In the first embodiment, the case where whether or not the kick operation is applied to the bit line BL is controlled by the node INV (ADL) of the latch circuit ADL is given as an example, but the present disclosure is not limited thereto. For example, as in the second embodiment, the bus LBUS may be used. In this case, the bus LBUS is connected to the gate of each of the transistor 52 and transistor 53.

Similarly, in the second embodiment, the case where whether or not the kick operation is applied to the bit line BL is controlled by the bus LBUS is given as an example, but the present disclosure is not limited to this. For example, as in the first embodiment, the node INV (ADL) of the latch circuit ADL may be used. In this case, the gate of the transistor 83 is connected to the node INV (ADL).

In the above embodiment, the case where the voltage of the selected word line WLsel becomes the same voltage as the voltage of the selected signal line CGsel is given as an example, but the present disclosure is not limited thereto. The voltage of the selected word line WLsel may be different from the voltage of the selected signal line CGsel, or may be changed based on the change of the selected signal line CGsel.

In the above embodiment, the case where triple-level cell (TLC) is applied as a method of storing data is given as an example, but the present disclosure is not limited thereto.

For example, even in a case where the memory cell transistor MT stores data of 2 bits or 4 bits or more, the semiconductor memory 1 can execute the read operation described in the above embodiment.

In the above embodiment, the timing at which the kick operation is started may be set to any timing. The timing at which the kick operation is started may be included at least in a period from the start of application of the corresponding read voltage to stabilization at the read voltage.

In the modification example of the above embodiment, the case where the kick operation for the selected signal line CGsel is omitted when the read voltage transitions from the higher value to the lower value is given as an example, but the present disclosure is not limited to this. For example, in a case where the read voltage transitions from the higher value to the lower value, the kick operation for the selected signal line CGsel may be executed. In this case, the kick amount in the kick operation can be set to, for example, a negative value.

In the above embodiment, the case where the end portion of the word line WL is formed in a stepwise shape with three rows in the extraction area HA is given as an example, but the present disclosure is not limited thereto. For example, the end portion of the word line WL may have a stair structure of two rows or four or more rows.

In the above embodiment, the case where the directions in which the voltages are applied to the blocks BLK arranged in the Y direction are different between the even-numbered blocks BLK and the odd-numbered blocks BLK is given as an example, but the present disclosure is limited to this. For example, the extraction area HA may be provided only on one side in the X direction with respect to the cell area CA. In this case, a voltage is applied to the stacked wiring corresponding to each block BLK from the same direction.

In the above embodiment, the case where the voltage is applied from one side in the X direction with respect to the stacked wiring such as the word line WL is given as an example, but the present disclosure is not limited thereto. For example, in a certain block BLK, a contact CC is provided in each of the extraction areas HA1 and HA2, and a voltage may be applied to the word line WL or the like from both sides in the X direction. Even in such a case, for example, the influence of the RC delay may occur in the central portion of the word line WL, so the same effect can be obtained by applying any one of the above embodiments.

In the above embodiment, the circuit configuration of the sense amplifier module 16 may be variously changed. For example, the number of latch circuits in the sense amplifier unit SAU can be appropriately changed based on the number of bits stored in one memory cell transistor MT. Depending on the configuration of the sense amplifier module 16, the operation of "asserting the control signal STB" may correspond to the temporary change of the control signal STB from the "H" level to the "L" level by the sequencer 13.

In the above embodiment, the memory pillar MP may have a structure in which a plurality of pillars are connected in the Z direction. For example, the memory pillar MP may have a structure in which a pillar penetrating the conductor (the select gate line SGD) and a pillar penetrating a plurality of conductors 23 (the word line WL) are connected. Further, the memory pillar MP may have a structure in which a plurality of pillars each penetrating a plurality of conductors 23 are connected in the Z direction.

In the above embodiment, the structure in which the slits SLT and SLTa divide the conductor 24 is given as an example, but the slits SLT and SLTa may not divide the conductor 24. In this case, the memory pillar MP has a structure in which a plurality of pillars are connected in the Z direction. For example, a pillar provided below penetrates the conductors 22 and 23, and a pillar provided above penetrates the conductor 24. Then, the conductor 24 is divided by, for example, slits different from the slits SLT and SLTa, and each of the divided plurality of conductors 24 functions as a select gate line SGD.

In the semiconductor memory 1 according to the above embodiment, the conductors 23 and 24 may be formed by executing the replacement process using the slits SLT, SLTa, and SLTb, for example. In this case, for example, between the adjacent slits SLT and SLTb, a plurality of support columns, each being formed of an insulator and penetrating the stacked structure in which the conductors 23 and 24 are formed, may be formed.

In the above embodiment, the case where the semiconductor memory 1 has a structure in which the circuit such as the sense amplifier module 16 is provided under the memory cell array 10 is given as an example, but the disclosure is not limited thereto. For example, the semiconductor memory 1 may have a structure in which the memory cell array 10 is formed on the semiconductor substrate 20. In this case, in the memory pillar MP, for example, the semiconductor 31 is electrically connected to the source line SL trough the lower surface of the memory pillar MP.

In the above embodiments, the structure of the memory cell array 10 may be another structure. The other configurations of the memory cell array 10 are described in, for example, U.S. patent application Ser. No. 12/407,403 filed on Mar. 19, 2009, entitled "three-dimensional stacked nonvolatile semiconductor memory". It is described in U.S. patent application Ser. No. 12/406,524 filed on Mar. 18, 2009, entitled "a three-dimensional stacked nonvolatile semiconductor memory" and U.S. patent application Ser. No. 12/679,991 filed on Mar. 25, 2010, entitled "a nonvolatile semiconductor memory device and a method of manufacturing the same". It is described in U.S. patent application Ser. No. 12/532,030 filed on Mar. 23, 2009, entitled "a semiconductor memory and a method of manufacturing the same". These patent applications are incorporated herein by reference in its entirety.

In the above embodiments, the block BLK may not be an erase unit. The other erase operations are described in U.S. patent application Ser. No. 13/235,389 filed on Sep. 18, 2011, entitled "nonvolatile semiconductor memory device", and U.S. patent application Ser. No. 12/694,690 filed on Jan. 27, 2010, entitled "nonvolatile semiconductor memory device". These patent applications are incorporated herein by reference in its entirety.

In the above embodiments, the case where the memory cell transistors MT provided in the memory cell array 10 are three-dimensionally stacked is described as an example, but the present disclosure is not limited thereto. For example, the configuration of the memory cell array 10 may be a plane NAND flash memory in which the memory cell transistors MT are two-dimensionally disposed.

In the present specification, the "connection" means that it is electrically connected, and for example, it does not exclude that another element is interposed therebetween. Further, in the present specification, the "off state" means that a voltage less than the threshold voltage of the transistor is applied to the gate of the corresponding transistor, and for example, it does not exclude that a minute current such as a leak current of the transistor flows.

In the present specification, "the period during which the controller applies the read voltage" corresponds to, for example, in FIG. 13, the period from the time t1 to the time t4 corresponding to the read voltage AR and the period from the time t4 to the time t7 corresponding to the read voltage ER. That is, in the present specification, the period includes a time at which the application of the read voltage is started and a period during which the kick operation is executed.

In the present specification, the word "conductivity type" is used to distinguish between an n-channel MOS transistor and a p-channel MOS transistor. For example, a transistor of a first conductivity type corresponds to an n-channel MOS transistor, and a transistor of a second conductivity type which is different from the first conductivity type corresponds to a p-channel MOS transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
   a plurality of memory cell transistors, a threshold voltage of each of the memory cell transistor being changeable to store multi-bit data;
   a word line which is electrically connected to gates of the memory cell transistors;
   a plurality of bit lines which are electrically connected to one ends of the memory cell transistors, respectively;
   a source line which is electrically connected to the other ends of the memory cell transistors;
   a plurality of sense amplifier units which are electrically connected to the bit lines, respectively, each of the sense amplifier units including a sense amplifier, a first latch, and a second latch; and
   a controller,
   wherein each of the sense amplifiers includes
      a first transistor having a gate to which a first control signal is supplied, one end electrically connected to a corresponding one of the bit lines, and the other end electrically connected to a first node,
      a second transistor having a gate to which a second control signal is supplied and one end electrically connected to the other end of the first transistor,
      a third transistor having a gate to which a signal based on data stored in a corresponding one of the first latches is supplied, one end electrically connected to the other end of the second transistor, and the other end electrically connected to a power supply node,
      a fourth transistor having a gate to which a third control signal is supplied and one end electrically connected to the other end of the first transistor, and
      a fifth transistor having a gate to which a signal based on data stored in a corresponding one of the second latches is supplied and one end electrically connected to the other end of the fourth transistor.

2. The semiconductor memory according to claim 1, wherein, in each of the sense amplifiers, each of the first latch and the second latch is a static latch.

3. The semiconductor memory according to claim 1,
   wherein the memory cell transistors includes a first memory cell transistor and a second memory cell transistor, and the bit lines includes a first bit line electrically connected to the one end of the first memory cell transistor and a second bit line electrically connected to the one end of the second memory cell transistor, and
   wherein the sense amplifiers includes a first sense amplifier electrically connected to the first bit line and a second sense amplifier electrically connected to the second bit line, and
   wherein, when the controller performs an operation, the first sense amplifier supplies a first voltage higher than a ground voltage to the first bit line, and the second sense amplifier supplies a second voltage lower than the first voltage and higher than the ground voltage to the second bit line.

4. The semiconductor memory according to claim 3, wherein
   when the controller performs the operation, the first sense amplifier supplies the first voltage to the first bit line through the first transistor and the second transistor, and the second sense amplifier supplies the second voltage to the second bit line through the first transistor and the fourth transistor.

5. The semiconductor memory according to claim 1, wherein each of the sense amplifiers further includes
   a sixth transistor having a gate to which a signal based on data stored in a corresponding one of the second latches is supplied, one end electrically connected to the other end of the second transistor, and the other end electrically connected to the other end of the fifth transistor, a seventh transistor having a gate to which a fourth control signal is supplied, one end electrically connected to the other end of the fifth transistor and the other end of the sixth transistor, and the other end electrically connected to the one end of the third transistor, and an eighth transistor having a gate to which a fifth control signal is supplied, one end electrically connected to the other end of the fifth transistor and the other end of the sixth transistor, and the other end electrically connected to a sense node.

6. The semiconductor memory according to claim 5, wherein a threshold voltage of the first memory cell transistor is set to be higher than a threshold voltage of the second memory cell transistor, and when the controller performs a read operation, at a first time of a first period during which the controller applies a first read voltage to the word line, the controller sets the second control signal to a first voltage higher than a ground voltage, and sets the third control signal to a second voltage lower than the first voltage and higher than the ground voltage, and the first sense amplifier applies a voltage to the first bit line through the first transistor and the second transistor, and the second sense amplifier applies a voltage to the second bit line through the first transistor and the fourth transistor.

7. The semiconductor memory according to claim 6, wherein at a second time in the first period that is later than the first time, the controller sets the second control signal to the second voltage, and sets the third control signal to the second voltage.

8. The semiconductor memory according to claim 7, wherein when the controller performs a read operation, the controller applies a second read voltage which is lower than the first read voltage to the word line, before applying the first read voltage to the word line, and at a third time in a second period when the controller applies the second read voltage, the first sense amplifier applies a voltage to the first bit line through the first transistor and the second transistor, and the second sense amplifier applies a voltage to the second bit line through the first transistor and the second transistor.

9. The semiconductor memory according to claim 8, wherein during the read operation, the controller updates information stored in the second latches based on respective reading results obtained through the bit lines during the second period.

* * * * *